US012708043B2

(12) United States Patent
Matsubara et al.

(10) Patent No.: US 12,708,043 B2
(45) Date of Patent: Aug. 11, 2026

(54) SEMICONDUCTOR DEVICE WITH WIRE INCLUDING A SURFACE METAL LAYER COVERING A CORE METAL

(71) Applicant: ROHM CO., LTD., Kyoto (JP)

(72) Inventors: Hiroaki Matsubara, Kyoto (JP); Taro Nishioka, Kyoto (JP); Yoshizo Osumi, Kyoto (JP); Tomohira Kikuchi, Kyoto (JP); Moe Yamaguchi, Kyoto (JP); Ryohei Umeno, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 470 days.

(21) Appl. No.: 18/267,455

(22) PCT Filed: Nov. 22, 2021

(86) PCT No.: PCT/JP2021/042726
§ 371 (c)(1),
(2) Date: Jun. 15, 2023

(87) PCT Pub. No.: WO2022/130906
PCT Pub. Date: Jun. 23, 2022

(65) Prior Publication Data

US 2024/0047438 A1 Feb. 8, 2024

(30) Foreign Application Priority Data

Dec. 18, 2020 (JP) ................................ 2020-209996

(51) Int. Cl.
*H10W 90/00* (2026.01)
*H10W 70/40* (2026.01)
*H10W 74/10* (2026.01)
*H10W 72/50* (2026.01)

(52) U.S. Cl.
CPC ......... *H10W 90/00* (2026.01); *H10W 70/456* (2026.01); *H10W 74/111* (2026.01);
(Continued)

(58) Field of Classification Search
CPC ...................................................... H01L 25/16
(Continued)

(56) References Cited

U.S. PATENT DOCUMENTS

2003/0201548 A1* 10/2003 Ikezawa ................ C08K 5/521 257/793
2006/0091536 A1* 5/2006 Huang ................... H01L 24/48 257/734

(Continued)

FOREIGN PATENT DOCUMENTS

JP 2001135794 A * 5/2001 ............ H01L 24/06
JP 2002164437 A 6/2002

(Continued)

OTHER PUBLICATIONS

International Search Report and Written Opinion mailed on Dec. 28, 2021, received for PCT Application PCT/JP2021/042726, filed on Nov. 22, 2021, 7 pages including English Translation.

(Continued)

*Primary Examiner* — Ajay Arora
(74) *Attorney, Agent, or Firm* — XSENSUS LLP

(57) ABSTRACT

A semiconductor device includes first and second semiconductor elements, and first and second circuits at different potentials. The second semiconductor element, electrically connected to the first semiconductor element, relays mutual signals between the first and the second circuits, while insulating them. The semiconductor device further includes a first terminal lead electrically connected to the first semiconductor element, a first wire connected to the first and the second semiconductor elements, and a second wire connected to the first semiconductor element and the first terminal lead. The first wire contains a first metal. The second wire includes a first core containing a second metal, and a first surface layer containing a third metal and covering the first core. The second metal has a smaller atomic (Continued)

number than that of the first metal. The third metal has a greater bonding strength with respect to the first terminal lead than the second metal.

15 Claims, 14 Drawing Sheets

(52) U.S. Cl.
CPC ........ *H10W 72/50* (2026.01); *H10W 72/5363* (2026.01); *H10W 72/552* (2026.01); *H10W 72/5522* (2026.01); *H10W 72/5525* (2026.01); *H10W 72/555* (2026.01); *H10W 72/581* (2026.01); *H10W 90/756* (2026.01); *H10W 90/759* (2026.01)

(58) Field of Classification Search
USPC .......................................................... 257/734
See application file for complete search history.

(56) References Cited

U.S. PATENT DOCUMENTS

2013/0313574 A1* 11/2013 Hanada ............. H01L 23/49866 257/77
2014/0220744 A1* 8/2014 Damberg ............ H01L 21/4853 438/127
2016/0307854 A1* 10/2016 Matsubara .............. H01L 24/49

FOREIGN PATENT DOCUMENTS

JP 2014-030049 A 2/2014
JP 2016207714 A 12/2016
JP 2017123342 A * 7/2017 ....... H10K 59/80522
JP 2018117026 A 7/2018
JP 2019-145829 A 8/2019
JP 2019134181 A 8/2019
JP 2020010067 A * 1/2020 ........... H01L 23/532
JP 2020031238 A * 2/2020 ............. H01L 24/45

OTHER PUBLICATIONS

Japanese Office Action mailed Jul. 22, 2025 received in corresponding Japanese Patent application No. 2022-569807 (11 pages; with English translation).
Office Action issued Oct. 9, 2023 in German Patent Application No. 11 2021 006 079.1 and Informal English Translation thereof, 11 pages.
Decision of Refusal mailed Nov. 25, 2025 in corresponding Japanese patent application No. 2022-569807 (8 pages; with English translation).

* cited by examiner

SEMICONDUCTOR DEVICE WITH WIRE INCLUDING A SURFACE METAL LAYER COVERING A CORE METAL

CROSS-REFERENCE TO RELATED APPLICATIONS

The present application is based on PCT filing PCT/JP2021/042726, filed Nov. 22, 2021, and claims priority to JP 2020-209996, filed Dec. 18, 2020, the entire contents of each are incorporated herein by reference.

TECHNICAL FIELD

The present disclosure relates to a semiconductor device. In particular, the present disclosure relates to a semiconductor device in which signal transmission is performed via an insulating element between a plurality of semiconductor elements mounted within a single package.

BACKGROUND ART

Inverters are conventionally used in electric vehicles (including hybrid vehicles) and home appliances, for example. Such an inverter uses various semiconductor devices. For example, the inverter includes a semiconductor device for controlling and driving, and a semiconductor device for switching (a switching element such as an insulated gate bipolar transistor (IGBT) or a metal oxide semiconductor field effect transistor (MOSFET)). The former semiconductor device includes a controller and a gate driver. An engine control unit (ECU) in the inverter outputs a control signal, which is then inputted to the controller of the semiconductor device. The controller converts the control signal into a pulse width modulation (PWM) control signal and transmits the PWM control signal to the gate driver. The gate driver causes a plurality of (e.g., six) switching elements to drive at a desired timing based on the PWM control signal. As a result, three-phase AC power for motor driving is generated from the DC power of an on-vehicle battery. For example, Patent Document 1 discloses an example of a semiconductor device (drive circuit) used for a motor driving device.

In the conventional semiconductor device as described above, the source voltage required for the controller may be different from the source voltage required for the gate driver. If this occurs in a semiconductor device in which a plurality of semiconductor elements are mounted within a single package, there will be a difference in applied source voltage between two conductive paths, i.e., a conductive path to a controller and a conductive path to a gate driver. In view of this, an insulating element may be provided as a relay between these conductive paths. However, a wire for connection to the insulating element causes a significant decrease in dielectric strength when the wire is near the insulating element.

PRIOR ART DOCUMENT

Patent Document

Patent Document 1: JP-A-2014-30049

SUMMARY OF THE INVENTION

Problem to be Solved by the Invention

In view of the foregoing circumstances, an object of the present disclosure is to provide a semiconductor device capable of reducing the cost thereof while ensuring the required dielectric strength.

Means to Solve the Problem

Provided by the present disclosure, a semiconductor device includes: a first semiconductor element; a first circuit and a second circuit that have different potentials from each other; a second semiconductor element that is electrically connected to the first semiconductor element, the second semiconductor element relaying a mutual signal between the first circuit and the second circuit and insulating the first circuit and the second circuit from each other; a first terminal lead electrically connected to the first semiconductor element; a first wire connected to the first semiconductor element and the second semiconductor element; and a second wire connected to the first semiconductor element and the first terminal lead. The first wire contains a first metal. The second wire includes a first core containing a second metal, and a first surface layer containing a third metal and covering the first core. An atomic number of the second metal is smaller than an atomic number of the first metal. The third metal has a greater bonding strength with respect to the first terminal lead than the second metal.

Advantages of the Invention

The configuration described above can reduce the cost of the semiconductor device while ensuring the required dielectric strength.

Other features and advantages of the present disclosure will be more apparent from the detailed description given below with reference to the accompanying drawings.

MODE FOR CARRYING OUT THE INVENTION

Embodiments of the present disclosure will be described with reference to the accompanying drawings.

Figure 1:
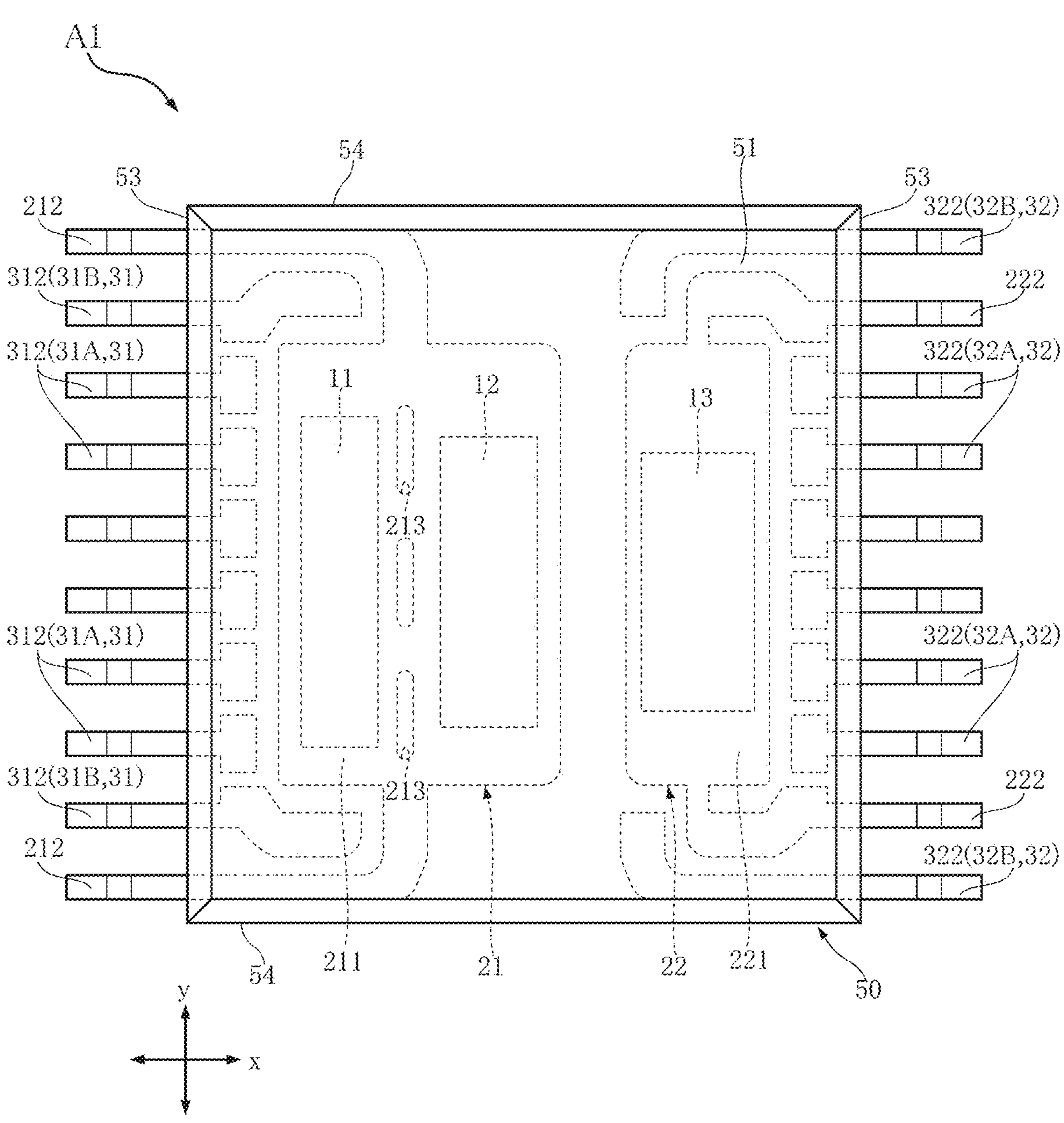
FIG. 1 is a plan view illustrating a semiconductor device according to a first embodiment of the present disclosure.
Figure 2:
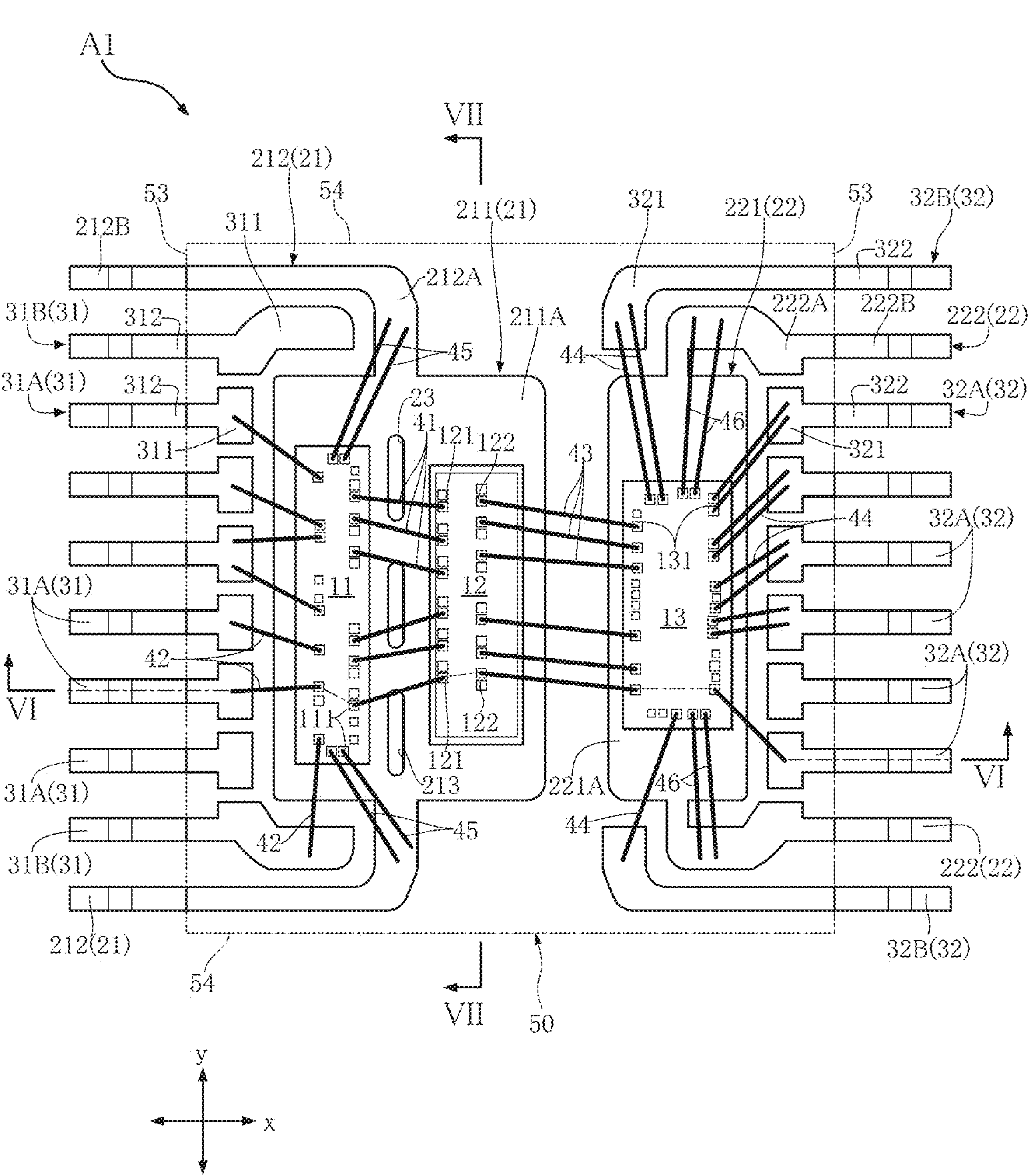
FIG. 2 is a plan view corresponding to FIG. 1, as seen through a sealing resin.

The following describes a semiconductor device A1 according to a first embodiment of the present disclosure, with reference to FIGS. 1 to 11. The semiconductor device A1 includes a first semiconductor element 11, a second semiconductor element 12, a third semiconductor element 13, a first island lead 21, a second island lead 22, a plurality of first terminal leads 31, a plurality of second terminal leads 32, and a sealing resin 50. Furthermore, the semiconductor device A1 includes a plurality of first wires 41, a plurality of second wires 42, a plurality of third wires 43, a plurality of fourth wires 44, a plurality of fifth wires 45, and a plurality of sixth wires 46. The semiconductor device A1 is surface-mounted on the wiring board of an inverter for an electric vehicle (or a hybrid vehicle), for example. The semiconductor device A1 is in a small outline package (SOP). Note that the package type of the semiconductor device A1 is not limited to an SOP. In FIG. 2, the sealing resin 50 is shown transparent, and is indicated by an imaginary line (two-dot chain line).

In the description of the semiconductor device A1, the thickness direction of each of the first semiconductor element 11, the second semiconductor element 12, the third semiconductor element 13, the first island lead 21, the second island lead 22, the first terminal leads 31, and the second terminal leads 32 is referred to as "thickness direction z". Two directions perpendicular to the thickness direction z and perpendicular to each other are referred to as "first direction" and "second direction", respectively. In the figures, the x direction is an example of the first direction, and the y direction is an example of the second direction, but the present disclosure is not limited to this.

The first semiconductor element 11, the second semiconductor element 12, and the third semiconductor element 13 form the functional core of the semiconductor device A1. In the semiconductor device A1, each of the first semiconductor element 11, the second semiconductor element 12, and the third semiconductor element 13 is an individual element. In the first direction x, the third semiconductor element 13 is located opposite from the first semiconductor element 11 with respect to the second semiconductor element 12. As viewed in the thickness direction z, each of the first semiconductor element 11, the second semiconductor element 12, and the third semiconductor element 13 has a rectangular shape with its longer sides extending in the second direction y.

The first semiconductor element 11 is the controller (control element) of a gate driver for driving a switching element such as an IGBT or a MOSFET. The first semiconductor element 11 has a circuit that converts a control signal inputted from, for example, an ECU into a PWM control signal, a transmission circuit that transmits the PWM control signal to the third semiconductor element 13, and a reception circuit that receives an electric signal from the third semiconductor element 13.

The third semiconductor element 13 is a gate driver (drive element) for driving the switching element. The third semiconductor element 13 has a reception circuit that receives a PWM control signal, a circuit that drives the switching element based on the PWM control signal, and a transmission circuit that transmits an electric signal to the first semiconductor element 11. The electric signal may be an output signal from a temperature sensor located near a motor.

The second semiconductor element 12 transmits a PWM control signal or other electric signals in an electrically insulated state. In the semiconductor device A1, the second semiconductor element 12 is of an inductive type. An example of the inductive second semiconductor element 12 is an insulating transformer. The insulating transformer transmits an electric signal in an electrically insulated state by inductively coupling two inductors (coils). The second semiconductor element 12 has a silicon substrate. Inductors made of copper (Cu) are mounted on the substrate. The inductors include a transmission inductor and a reception inductor, which are stacked in the thickness direction z. A dielectric layer made of, for example, silicon dioxide ($SiO_2$) is provided between the transmission inductor and the reception inductor. The dielectric layer electrically insulates the transmission inductor from the reception inductor. Alternatively, the second semiconductor element 12 may be of a capacitive type. An example of the capacitive second semiconductor element 12 is capacitor. Alternatively, the second semiconductor element 12 may be a photocoupler.

In the semiconductor device A1, the third semiconductor element 13 requires a higher source voltage than the first semiconductor element 11. As a result, a high potential difference is created between the first semiconductor element 11 and the third semiconductor element 13. Accordingly, in the semiconductor device A1, a first circuit including the first semiconductor element 11 as a component and a second circuit including the third semiconductor element 13 as a component are insulated from each other by the second semiconductor element 12. The first circuit further includes the first island lead 21, the first terminal leads 31, the first wires 41, the second wires 42, and the fifth wires 45, in addition to the first semiconductor element 11. The second circuit further includes the second island lead 22, the second terminal leads 32, the third wires 43, the fourth wires 44, and the sixth wires 46, in addition to the third semiconductor element 13. The first circuit has a different potential from the second circuit. In the semiconductor device A1, the second circuit has a higher potential than the first circuit. As such, the second semiconductor element 12 relays a mutual signal between the first circuit and the second circuit. In the case of an inverter for an electric vehicle, the voltage applied to the ground of the first semiconductor element 11 is approximately 0 V, whereas the voltage applied to the ground of the third semiconductor element 13 becomes 600 V or higher transiently.

Figure 5:
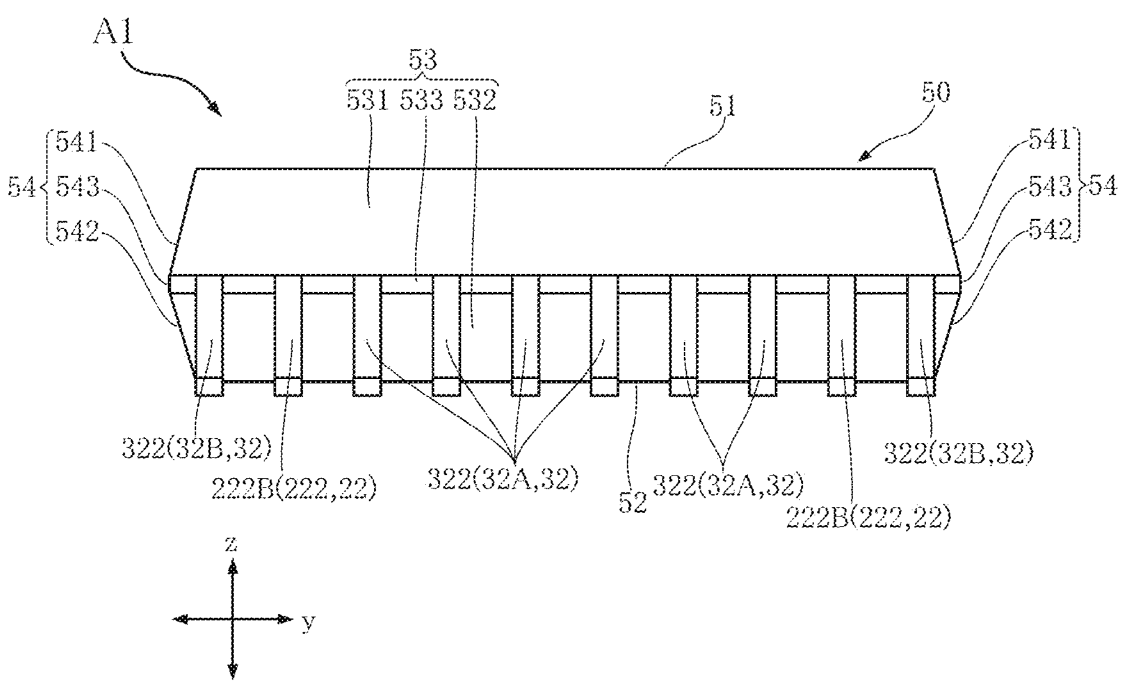
FIG. 5 is a right-side view illustrating the semiconductor device in FIG. 1.

As shown in FIGS. 2 and 5, the first semiconductor element 11 has a plurality of first metal layers 111. The first metal layers 111 are provided on an upper surface of the first semiconductor element 11 (i.e., a surface facing in the same direction as a first mounting surface 211A of a first island portion 211 of the first island lead 21 described below). The composition of the first metal layers 111 includes aluminum (Al), for example (in other words, each of the first metal layers 111 contains aluminum).

Figure 8:
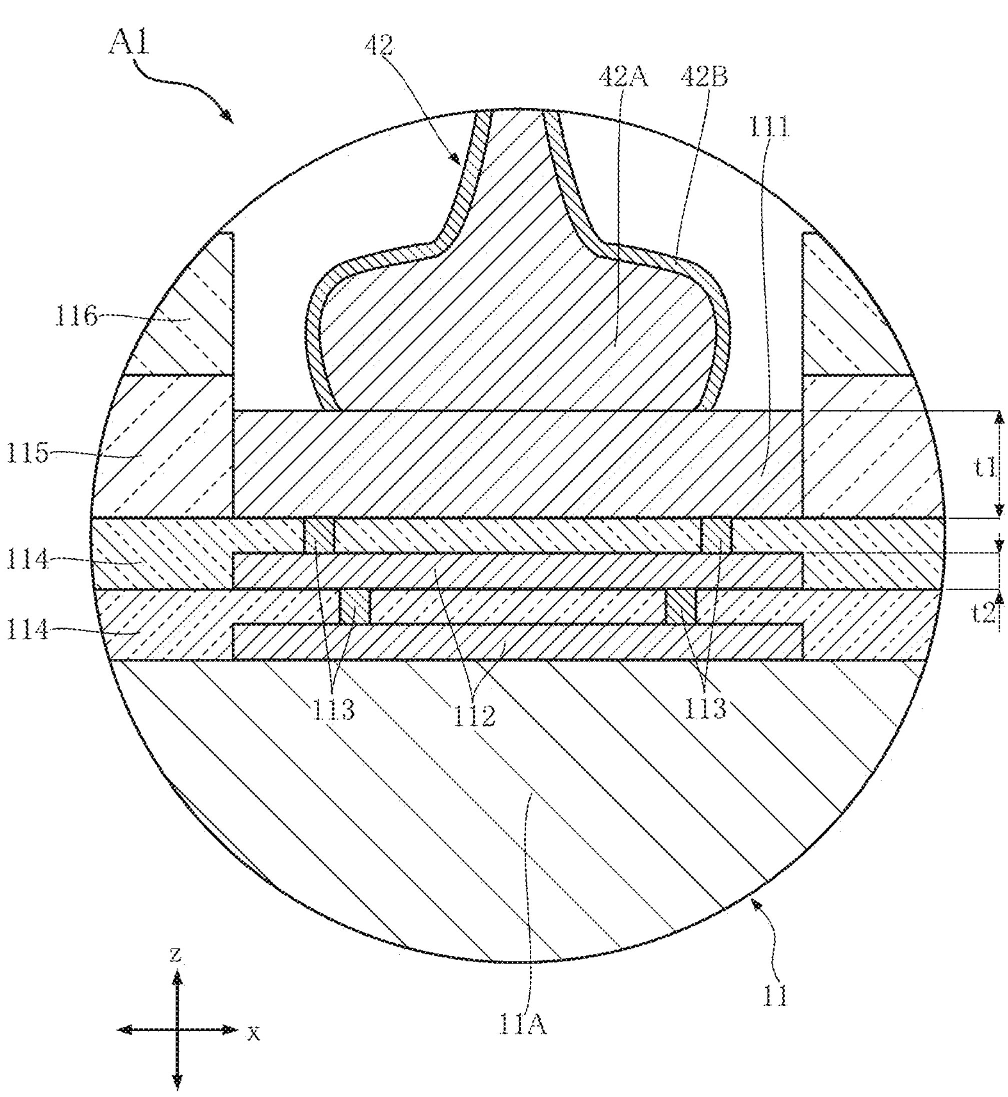
FIG. 8 is a partially enlarged cross-sectional view of FIG. 6.

As shown in FIG. 8, the first semiconductor element 11 further has an element body 11A, a plurality of second metal layers 112, a plurality of vias 113, a plurality of interlayer insulating films 114, a passivation film 115, and a surface protection film 116. The element body 11A includes a semiconductor substrate and a semiconductor layer. The second metal layers 112 overlap with one of the first metal layers 111 as viewed in the thickness direction z, and are positioned inward within the first semiconductor element 11 in the thickness direction z. The composition of the second metal layers 112 includes aluminum, for example. Each of the first metal layers 111 has higher flexural rigidity than each of the second metal layers 112. The difference in flexural rigidity is due to the fact that the thickness t1 of each of the metal layers 111 is larger than the thickness t2 of each of the second metal layers 112. The thickness t1 is in the range of 1.5 μm to 10 μm, both inclusive. The first metal layers 111 correspond to the electrodes of the first semiconductor element 11. The second metal layers 112 correspond to the redistribution layers of the first semiconductor element 11. The vias 113 and the second metal layers 112 form a conductive path between the element body 11A and the first metal layers 111. The interlayer insulating films 114 are stacked on the element body 11A. The second metal layers 112 and the vias 113 are covered with the interlayer insulating films 114. The interlayer insulating films 114 are made of silicon dioxide, for example. The passivation film 115 is formed on the interlayer insulating films 114, and covers a portion of each of the first metal layers 111. The passivation film 115 is made of silicon dioxide and silicon nitride ($Si_3N_4$), for example. The surface protection film 116 is formed on the passivation film 115. The first metal layers 111 are exposed from the surface protection film 116. The surface protection film 116 is made of polyimide, for example.

As shown in FIG. 2, the second semiconductor element 12 is positioned between the first semiconductor element 11 and the third semiconductor element 13 in the first direction x. A plurality of first electrodes 121 and a plurality of second electrodes 122 are provided on an upper surface of the second semiconductor element 12 (i.e., a surface facing in the same direction as the first mounting surface 211A mentioned above). Each of the first electrodes 121 and the second electrodes 122 is electrically connected to either the transmission inductor or the reception inductor. The first electrodes 121 are aligned in the second direction y, and are located closer to the first semiconductor element 11 than to the third semiconductor element 13 in the first direction x. The second electrodes 122 are aligned in the second direction y, and are located closer to the third semiconductor element 13 than to the first semiconductor element 11 in the first direction x.

As shown in FIG. 2, the third semiconductor element 13 has a plurality of third metal layers 131. The third metal layers 131 are provided on an upper surface of the third semiconductor element 13 (i.e., a surface facing in the same direction as a second mounting surface 221A of a second island portion 221 of the second island lead 22 described below). The composition of the third metal layers 131 includes aluminum, for example.

Figure 10:
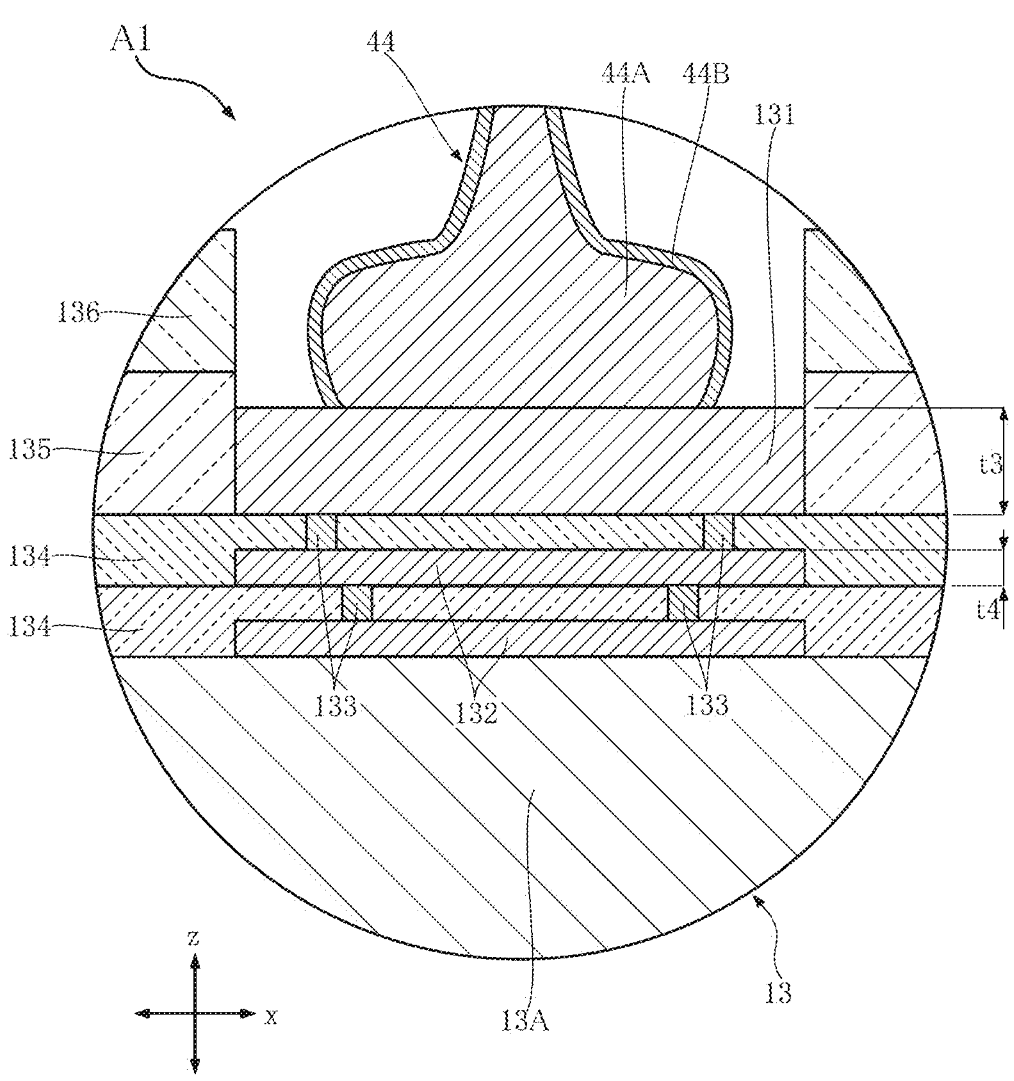
FIG. 10 is a partially enlarged cross-sectional view of FIG. 6.

As shown in FIG. 10, the third semiconductor element 13 further has an element body 13A, a plurality of fourth metal layers 132, a plurality of vias 133, a plurality of interlayer insulating films 134, a passivation film 135, and a surface protection film 136. The element body 13A includes a semiconductor substrate and a semiconductor layer. The fourth metal layers 132 overlap with one of the third metal layers 131 as viewed in the thickness direction z, and are positioned inward within the third semiconductor element 13 in the thickness direction z. The composition of the second metal layers 134 includes aluminum, for example. Each of the third metal layers 131 has higher flexural rigidity than each of the fourth metal layers 132. The difference in flexural rigidity is due to the fact that the thickness t3 of each of the third metal layers 131 is larger than the thickness t4 of each of the fourth metal layers 132. The thickness t3 is in the range of 1.5 μm to 10 μm, both inclusive. The third metal layers 131 correspond to the electrodes of the third semiconductor element 13. The fourth metal layers 132 correspond to the redistribution layers of the third semiconductor element 13. The vias 133 and the fourth metal layers 132 form a conductive path between the element body 13A and the third metal layers 131. The interlayer insulating films 134 are stacked on the element body 13A. The fourth metal layers 132 and the vias 133 are covered with the interlayer insulating films 134. The interlayer insulating films 134 are made of silicon dioxide, for example. The passivation film 135 is formed on the interlayer insulating films 134, and covers a portion of each of the third metal layers 131. The passivation film 135 is made of silicon dioxide and silicon nitride, for example. The surface protection film 136 is formed on the passivation film 135. The third metal layers 131 are exposed from the surface protection film 136. The surface protection film 136 is made of polyimide, for example.

The first island lead 21, the second island lead 22, the first terminal leads 31, and the second terminal leads 32 are conductive members forming a conductive path between a wiring board on which the semiconductor device A1 is mounted and each of the first semiconductor element 11, the second semiconductor element 12, and the third semiconductor element 13. These main components are formed from the same lead frame. The lead frame contains copper in its composition.

As shown in FIGS. 1 and 2, the first island lead 21 and the second island lead 22 are spaced apart from each other in the first direction x. In the semiconductor device A1, the first semiconductor element 11 and the second semiconductor element 12 are mounted on the first island lead 21, and the third semiconductor element 13 is mounted on the second island lead 22.

Figure 6:
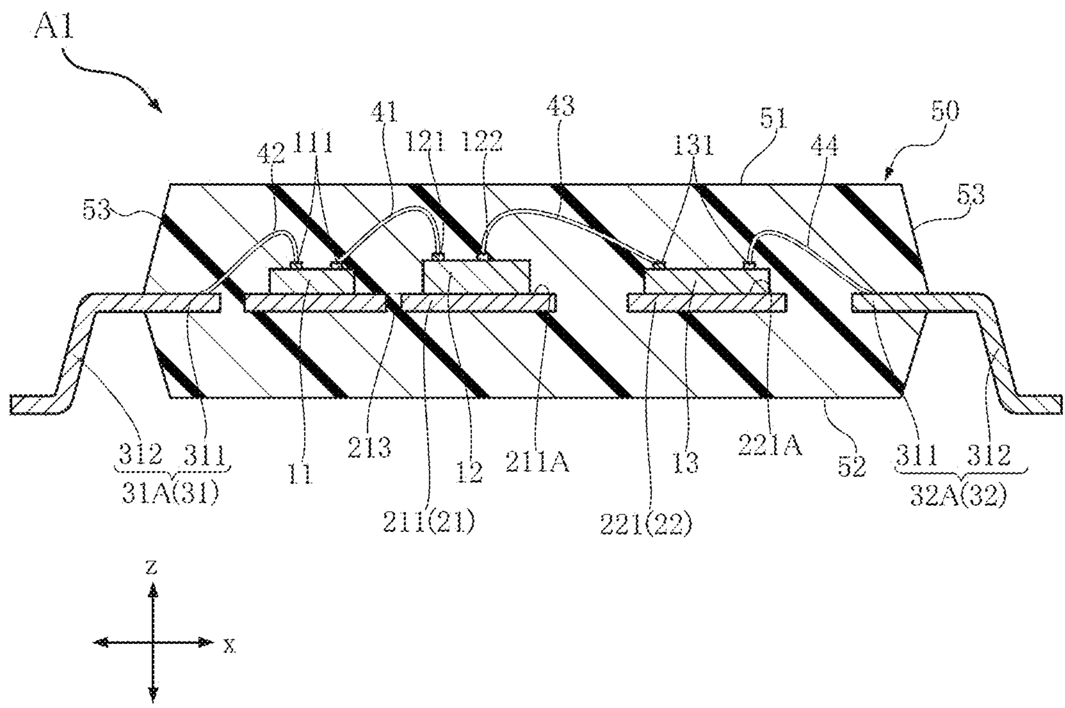
FIG. 6 is a cross-sectional view taken along line VI-VI in FIG. 2.
Figure 7:
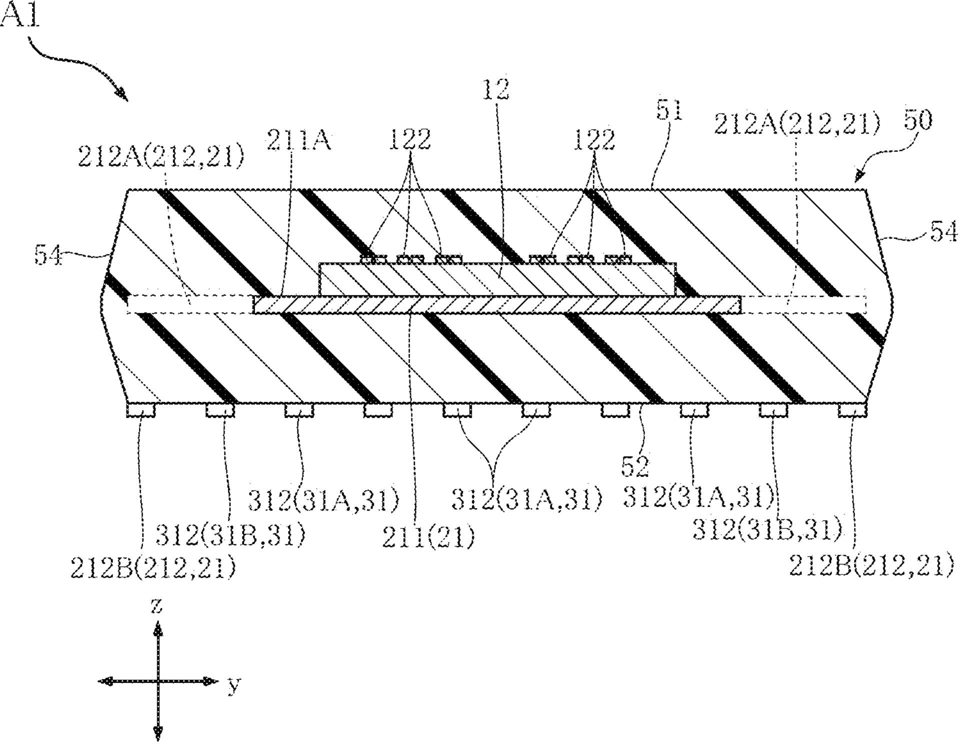
FIG. 7 is a cross-sectional view taken along line VII-VII in FIG. 2.

As shown in FIG. 2, the first island lead 21 has a first island portion 211 and two first terminal portions 212. As shown in FIGS. 6 and 7, the first island portion 211 has a first mounting surface 211A facing in the thickness direction z. In the semiconductor device A1, the first semiconductor element 11 and the second semiconductor element 12 are mounted on the first mounting surface 211A. The first semiconductor element 11 and the second semiconductor element 12 are bonded to the first mounting surface 211A via a non-illustrated conductive bonding member (e.g., solder or metal paste). The first island portion 211 is covered with the sealing resin 50. The first island portion 211 has a thickness of about 100 μm to 300 μm, for example.

As shown in FIGS. 2 and 6, the first island portion 211 is formed with a plurality of through holes 213. Each of the through holes 213 penetrates through the first island portion 211 in the thickness direction z and extends along the second direction y. As viewed in the thickness direction z, at least one of the through holes 213 is positioned between the first semiconductor element 11 and the second semiconductor element 12. The through holes 213 are aligned in the second direction y.

Figure 3:
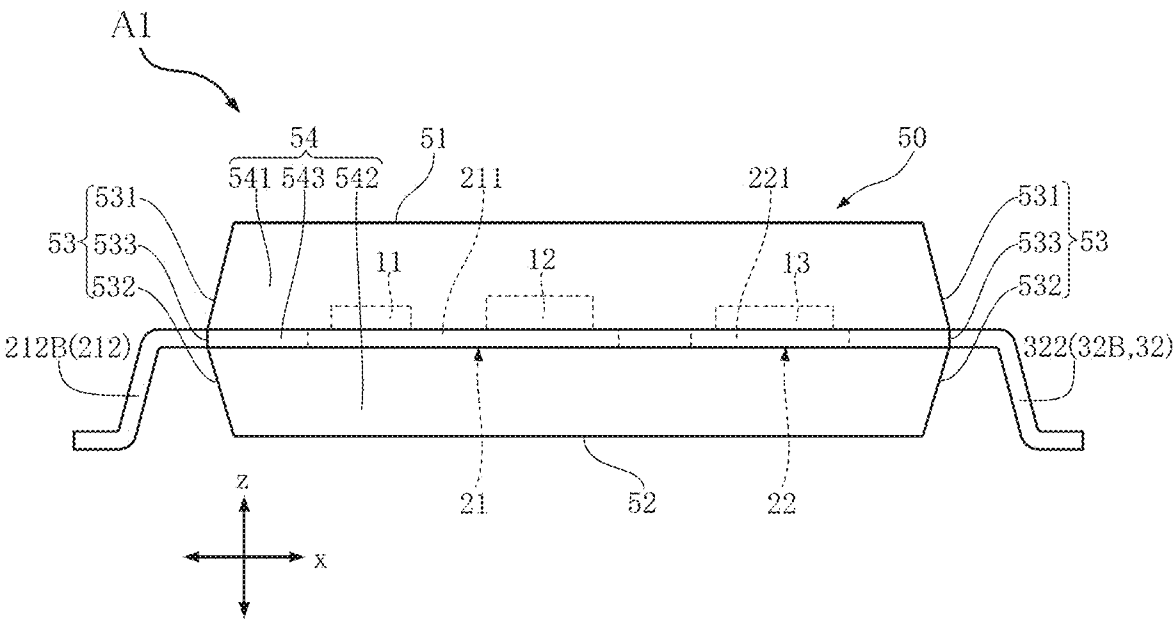
FIG. 3 is a front view illustrating the semiconductor device in FIG. 1.

As shown in FIG. 2, the two first terminal portions 212 extend from the respective sides of the first island portion 211 in the second direction y. The two first terminal portions 212 are located away from each other in the second direction y. At least one of the two first terminal portions 212 is electrically connected to the ground of the first semiconductor element 11 via the fifth wires 45. Each of the two first terminal portions 212 has a covered portion 212A and an exposed portion 212B. The covered portion 212A is connected to the first island portion 211 and covered with the sealing resin 50. The covered portion 212A has a metal layer 23 (see FIG. 13). The metal layer 23 is positioned on a surface of the covered portion 212A in a first sense of the thickness direction z (i.e., a sense of the thickness direction z in which the first mounting surface 211A of the first island portion 211 faces). The metal layer 23 is in contact with the sealing resin 50. The composition of the metal layer 23 includes silver (Ag). The exposed portion 212B is connected to the covered portion 212A, and is exposed from the sealing resin 50. As viewed in the thickness direction z, the exposed portion 212B extends in the first direction x. As shown in FIG. 3, the exposed portion 212B is bent into a gull-wing shape as viewed in the second direction y. The surface of the exposed portion 212B may be plated with tin (Sn), for example.

As shown in FIG. 2, the second island lead 22 has a second island portion 221 and two second terminal portions 222. As shown in FIG. 6, the second island portion 221 has a second mounting surface 221A facing in the thickness direction z. In the semiconductor device A1, the third semiconductor element 13 is mounted on the second mounting surface 221A. The third semiconductor element 13 is bonded to the second mounting surface 221A via a non-illustrated conductive bonding member (e.g., solder or metal paste). The second island portion 221 is covered with the sealing resin 50. The second island portion 221 has a thickness of about 100 μm to 300 μm, for example.

As shown in FIG. 2, the two second terminal portions 222 extend from the respective sides of the second island portion 221 in the second direction y. The two second terminal portions 222 are located away from each other in the second direction y. At least one of the two second terminal portions 222 is electrically connected to the ground of the third semiconductor element 13 via the sixth wires 46. Each of the two second terminal portions 222 has a covered portion 222A and an exposed portion 222B. The covered portion 222A is connected to the second island portion 221 and covered with the sealing resin 50. The covered portion 222A has a metal layer 23 (see FIG. 14). The metal layer 23 is positioned on a surface of the covered portion 222A in the first sense of the thickness direction z (i.e., a sense of the thickness direction z in which the second mounting surface 221A of the second island portion 221 faces). The exposed portion 222B is connected to the covered portion 222A, and is exposed from the sealing resin 50. As viewed in the thickness direction z, the exposed portion 222B extends in the first direction x. As shown in FIG. 3, the exposed portion 222B is bent into a gull-wing shape as viewed in the second direction y. The surface of the exposed portion 222B may be plated with tin, for example.

As shown in FIGS. 1 and 2, the first terminal leads 31 are located opposite from the second island portion 221 of the second island lead 22 with respect to the first island portion 211 of the first island lead 21 in the first direction x. The first terminal leads 31 are aligned in the second direction y. At least one of the first terminal leads 31 is electrically connected to the first semiconductor element 11 via the second wires 42. The first terminal leads 31 include a plurality of first inner leads 31A and two first outer leads 31B. The two first outer leads 31B flank the first inner leads 31A in the second direction y. Each of the two first outer leads 31B is positioned between one of the two first terminal portions 212 of the first island lead 21 and the first inner lead 31A closest to the first terminal portion 212 in the second direction y.

Figure 9:
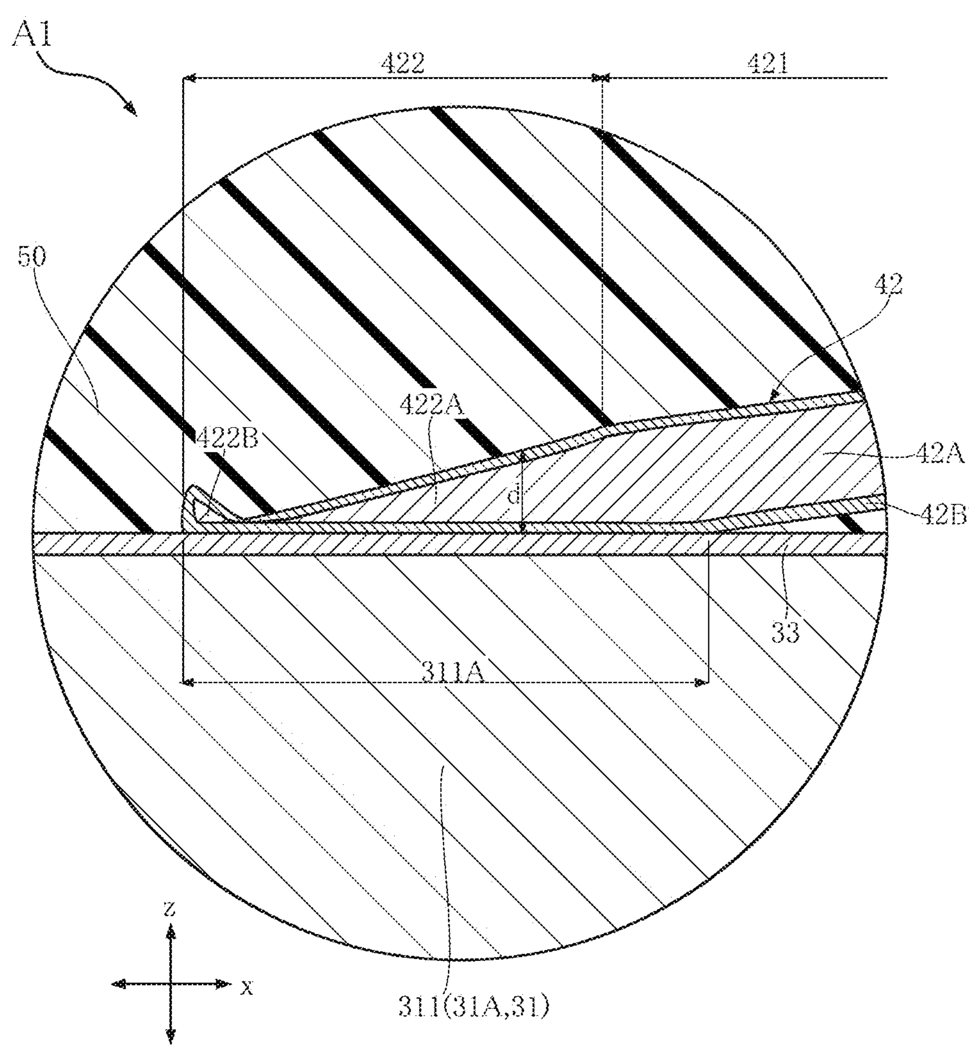
FIG. 9 is a partially enlarged cross-sectional view of FIG. 6.

As shown in FIGS. 2 and 6, each of the first terminal leads 31 has a covered portion 311 and an exposed portion 312. The covered portion 311 is covered with the sealing resin 50. The covered portion 311 of each of the two first outer leads 31B is larger in dimension than the covered portion 311 of each of the first inner leads 31A in the first direction x. As shown in FIG. 9, the covered portion 311 has a metal layer 33. The metal layer 33 is positioned on the covered portion 311 in the first sense of the thickness direction z (i.e., a sense of the thickness direction z in which the first mounting surface 211A of the first island portion 211 of the first island lead 21 faces). The metal layer 33 is in contact with the sealing resin 50. The composition of the metal layer 33 includes silver.

As shown in FIGS. 2 and 6, the exposed portion 312 is connected to the covered portion 311, and is exposed from the sealing resin 50. As viewed in the thickness direction z, the exposed portion 312 extends in the first direction x. The exposed portion 312 is bent into a gull-wing shape as viewed in the second direction y. The exposed portion 312 has the same shape as the exposed portion 212B of each of the two first terminal portions 212 of the first island lead 21. The surface of the exposed portion 312 may be plated with tin, for example.

As shown in FIGS. 1 and 2, the second terminal leads 32 are located opposite from the first terminal leads 31 with respect to the first island portion 211 of the first island lead 21 in the first direction x. The second terminal leads 32 are aligned in the second direction y. At least one of the second terminal leads 32 is electrically connected to the third semiconductor element 13 via the fourth wires 44. The second terminal leads 32 include a plurality of second inner leads 32A and two second outer leads 32B. The two second outer leads 32B flank the second inner leads 32A in the second direction y. In the second direction y, each of the two second terminal portions 222 of the second island lead 22 is positioned between one of the two second outer leads 32B and the second inner lead 32A closest to the second outer lead 32B.

Figure 11:
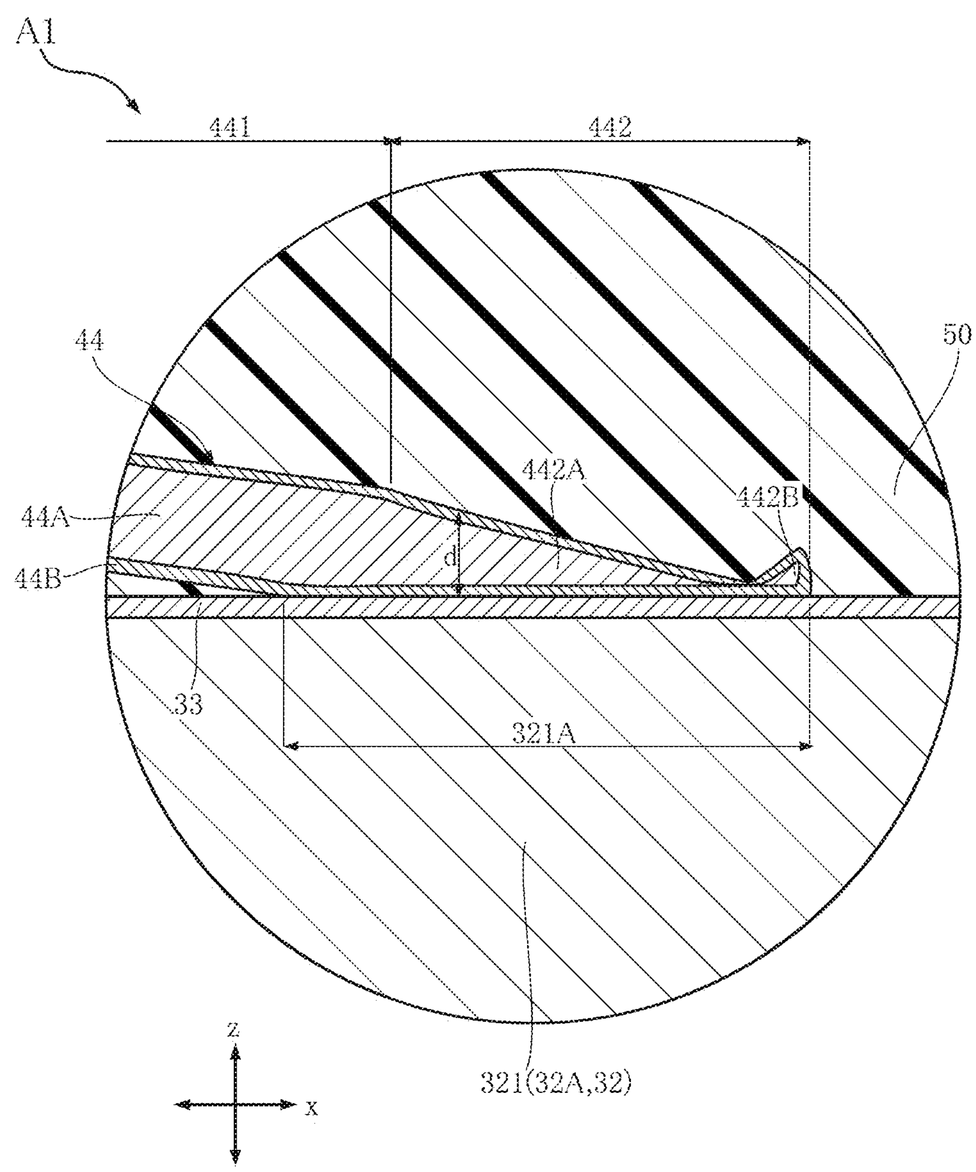
FIG. 11 is a partially enlarged cross-sectional view of FIG. 6.

As shown in FIGS. 2 and 6, each of the second terminal leads 32 has a covered portion 321 and an exposed portion 322. The covered portion 321 is covered with the sealing resin 50. The covered portion 321 of each of the two second outer leads 32B is larger in dimension than the covered portion 321 of each of the second inner leads 32A in the first direction x. As shown in FIG. 11, the covered portion 321 has a metal layer 33. The metal layer 33 is positioned on the covered portion 321 in the first sense of the thickness direction z (i.e., a sense of the thickness direction z in which the second mounting surface 221A of the second island portion 221 of the second island lead 22 faces). The metal layer 33 is in contact with the sealing resin 50.

As shown in FIGS. 2 and 6, the exposed portion 322 is connected to the covered portion 321, and is exposed from the sealing resin 50. As viewed in the thickness direction z, the exposed portion 322 extends in the first direction x. As shown in FIG. 3, the exposed portion 322 is bent into a gull-wing shape as viewed in the second direction y. The exposed portion 322 has the same shape as the exposed portion 222B of each of the two second terminal portions 222 of the second island lead 22. The surface of the exposed portion 322 may be plated with tin, for example.

The first wires 41, the second wires 42, the third wires 43, the fourth wires 44, the fifth wires 45, and the sixth wires 46, as well as the first island lead 21, the second island lead 22, the first terminal leads 31, and the second terminal leads 32, form a conductive path for the first semiconductor element 11, the second semiconductor element 12, and the third semiconductor element 13 to perform predetermined functions.

As shown in FIGS. 2 and 6, each of the first wires 41 is connected to one of the first electrodes 121 of the second semiconductor element 12 and one of the first metal layers 111 of the first semiconductor element 11. As a result, the first semiconductor element 11 and the second semiconductor element 12 are electrically connected to each other. The first wires 41 are aligned in the second direction y. Each of the first wires 41 contains a first metal. The first metal is gold (Au).

As shown in FIGS. 2 and 6, each of the second wires 42 is connected to one of the first metal layers 111 of the first semiconductor element 11 and the covered portion 311 of one of the first terminal leads 31. As a result, at least one of the first terminal leads 31 is electrically connected to the first semiconductor element 11. As shown in FIGS. 8 and 9, each of the second wires 42 includes a first core 42A, and a first surface layer 42B covering the first core 42A. The first core 42A contains a second metal. The atomic number of the second metal is smaller than the atomic number of the first metal described above. The second metal is copper. The first surface layer 42B contains a third metal. The first surface layer 42B is in contact with the first metal layer 111 and the metal layer 33 of the covered portion 311. The third metal has a greater bonding strength with respect to the first terminal leads 31 than the second metal. The third metal is palladium (Pd).

As shown in FIG. 9, each of the second wires 42 has a first main portion 421 and a first end portion 422. The first end portion 422 is located between the first main portion 421 and the covered portion 311 of the first terminal lead 31. The first end portion 422 has a first tapered portion 422A. The first tapered portion 422A is adjacent to the first main portion 421, and the dimension d of the first tapered portion 422A in the thickness direction z decreases with distance from the first main portion 421. A bonding interface 311A between the covered portion 311 and the second wire 42 extends over the first main portion 421 and the first end portion 422 as viewed in the thickness direction z. The first end portion 422 has a first tip 422B. The first tip 422B is connected to the first tapered portion 422A, and protrudes from the first tapered portion 422A in the thickness direction z.

As shown in FIGS. 2 and 6, each of the third wires 43 is connected to one of the second electrodes 122 of the second semiconductor element 12 and one of the third metal layers 131 of the third semiconductor element 13. As a result, the third semiconductor element 13 and the second semiconductor element 12 are electrically connected to each other. The third wires 43 are aligned in the second direction y. In the semiconductor device A1, the third wires 43 bridge the first island portion 211 of the first island lead 21 and the second island portion 221 of the second island lead 22. Each of the third wires 43 contains a fourth metal. The fourth metal is gold.

As shown in FIGS. 2 and 6, each of the fourth wires 44 is connected to one of the third metal layers 131 of the third semiconductor element 13 and the covered portion 321 of one of the second terminal leads 32. As a result, at least one of the second terminal leads 32 is electrically connected to the third semiconductor element 13. As shown in FIGS. 10 and 11, each of the fourth wires 44 includes a second core 44A, and a second surface layer 44B covering the second core 44A. The second core 44A contains a fifth metal. The atomic number of the fifth metal is smaller than the atomic number of the fourth metal described above. The fifth metal is copper. The second surface layer 44B contains a sixth metal. The second surface layer 44B is in contact with the third metal layer 131 and the metal layer 33 of the covered portion 321. The sixth metal has a greater bonding strength with respect to the second terminal leads 32 than the fifth metal. The sixth metal is palladium.

As shown in FIG. 11, each of the fourth wires 44 has a second main portion 441 and a second end portion 442. The second end portion 442 is located between the second main portion 441 and the covered portion 321 of the second terminal lead 32. The second end portion 442 has a second tapered portion 442A. The second tapered portion 442A is adjacent to the second main portion 441, and the dimension d of the second tapered portion 442A in the thickness direction z decreases with distance from the second main portion 441. A bonding interface 321A between the covered portion 321 and the fourth wire 44 extends over the second main portion 441 and the second end portion 442 as viewed in the thickness direction z. The second end portion 442 has a second tip 442B. The second tip 442B is connected to the second tapered portion 442A, and protrudes from the second tapered portion 442A in the thickness direction z.

As shown in FIG. 2, each of the fifth wires 45 is connected to one of the first metal layers 111 of the first semiconductor element 11 and the covered portion 212A of one of the two first terminal portions 212 of the first island lead 21. As a result, at least one of the two first terminal portions 212 is electrically connected to the first semiconductor element 11.

As shown in FIG. 2, each of the sixth wires 46 is connected to one of the third metal layers 131 of the third semiconductor element 13 and the covered portion 222A of one of the two second terminal portions 222 of the second island lead 22. As a result, at least one of the two second terminal portions 222 is electrically connected to the third semiconductor element 13.

As shown in FIG. 1, the sealing resin 50 covers the first semiconductor element 11, the second semiconductor element 12, the third semiconductor element 13, and a portion of each of the first island lead 21, the second island lead 22, the first terminal leads 31, and the second terminal leads 32. Furthermore, the sealing resin 50 covers the first wires 41, the second wires 42, the third wires 43, the fourth wires 44, the fifth wires 45, and the sixth wires 46. The sealing resin 50 is electrically insulative. The sealing resin 50 insulates the first island lead 21 and the second island lead 22 from each other. The sealing resin 50 is made of a material containing a black epoxy resin, for example. The sulfur content of the sealing resin 50 per unit mass is no greater than 300 μg/g. As viewed in the thickness direction z, the sealing resin 50 has a rectangular shape.

Figure 4:
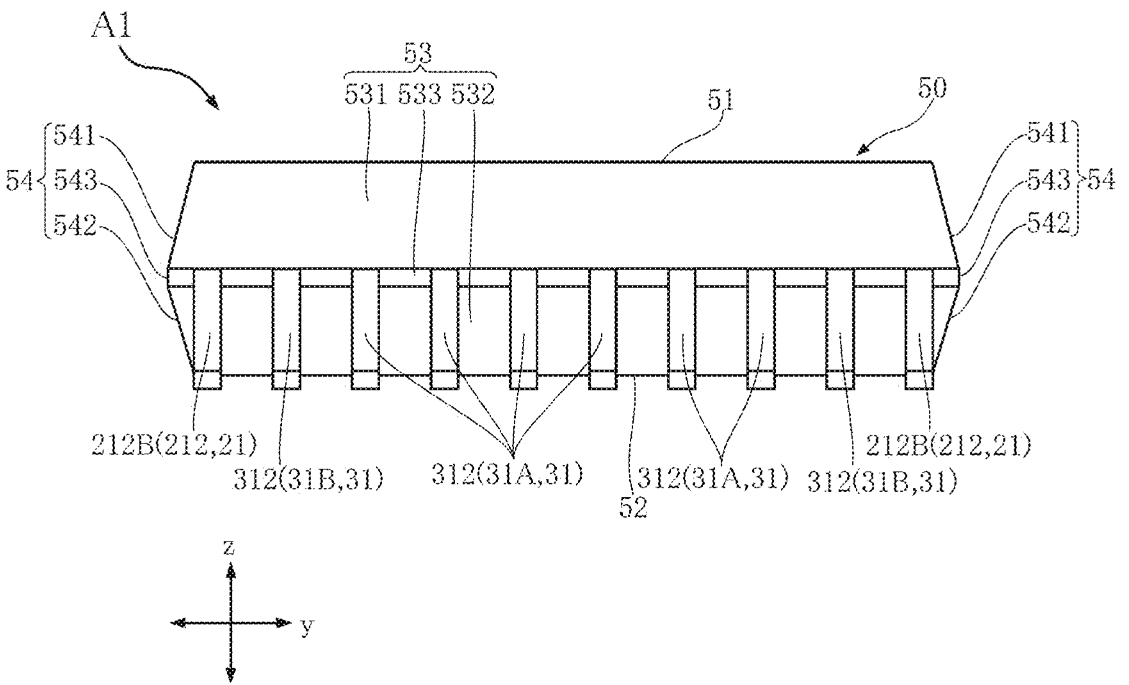
FIG. 4 is a left-side view illustrating the semiconductor device in FIG. 1.

As shown in FIGS. 3 to 5, the sealing resin 50 has a top surface 51, a bottom surface 52, a pair of first side surfaces 53, and a pair of second side surfaces 54.

As shown in FIGS. 3 to 5, the top surface 51 and the bottom surface 52 are spaced apart from each other in the thickness direction z. The top surface 51 and the bottom surface 52 face away from each other in the thickness direction z. Each of the top surface 51 and the bottom surface 52 is flat (or substantially flat).

As shown in FIGS. 3 to 5, the pair of first side surfaces 53 are connected to the top surface 51 and the bottom surface 52, and are spaced apart from each other in the first direction x. The exposed portions 212B of the two first terminal portions 212 of the first island lead 21 and the exposed portions 312 of the first terminal leads 31 are exposed from one of the pair of first side surfaces 53 that is located in a first sense of the first direction x. The exposed portions 222B of the two second terminal portions 222 of the second island lead 22 and the exposed portions 322 of the second terminal leads 32 are exposed from one of the pair of first side surfaces 53 that is located in a second sense of the first direction x.

As shown in FIGS. 3 to 5, each of the pair of first side surfaces 53 includes a first upper portion 531, a first lower portion 532, and a first intermediate portion 533. One end of the first upper portion 531 in the thickness direction z is connected to the top surface 51, and the other end thereof in the thickness direction z is connected to the first intermediate portion 533. The first upper portion 531 is inclined relative to the top surface 51. One end of the first lower portion 532 in the thickness direction z is connected to the bottom surface 52, and the other end thereof in the thickness direction z is connected to the first intermediate portion 533. The first lower portion 532 is inclined relative to the bottom surface 52. One end of the first intermediate portion 533 in the thickness direction z is connected to the first upper portion 531, and the other end thereof in the thickness direction z is connected to the first lower portion 532. The in-plane directions of the first intermediate portion 533 are the thickness direction z and the second direction y. As viewed in the thickness direction z, the first intermediate portion 533 is located more outward than the top surface 51 and the bottom surface 52. The exposed portions 212B of the two first terminal portions 212 of the first island lead 21, the exposed portions 222B of the two second terminal portions 222 of the second island lead 22, the exposed portions 312 of the first terminal leads 31, and the exposed portions 322 of the second terminal leads 32 are exposed from the first intermediate portions 533 of the pair of first side surfaces 53.

As shown in FIGS. 3 to 5, the pair of second side surfaces 54 are connected to the top surface 51 and the bottom surface 52, and are spaced apart from each other in the second direction y. As shown in FIG. 1, the first island lead 21, the second island lead 22, the first terminal leads 31, and the second terminal leads 32 are located away from the pair of second side surfaces 54.

As shown in FIGS. 3 to 5, each of the pair of second side surfaces 54 includes a second upper portion 541, a second lower portion 542, and a second intermediate portion 543. One end of the second upper portion 541 in the thickness direction is connected to the top surface 51, and the other end thereof in the thickness direction z is connected to the second intermediate portion 543. The second upper portion 541 is inclined relative to the top surface 51. One end of the second lower portion 542 in the thickness direction z is connected to the bottom surface 52, and the other end thereof in the thickness direction z is connected to the second intermediate portion 543. The second lower portion 542 is inclined relative to the bottom surface 52. One end of the second intermediate portion 543 in the thickness direction z is connected to the second upper portion 541, and the other end thereof in the thickness direction z is connected to the second lower portion 542. The in-plane directions of the second intermediate portion 543 are the thickness direction z and the second direction y. As viewed in the thickness direction z, the second intermediate portion 543 is located more outward than the top surface 51 and the bottom surface 52.

A motor driver circuit for an inverter is typically configured with a half-bridge circuit including a low-side (low-potential-side) switching element and a high-side (high-potential-side) switching element. The following description is provided with an assumption that these switching elements are MOSFETs. Note that the reference potential of the source of the low-side switching element and the reference potential of the gate driver for driving the low-side switching element are both ground. On the other hand, the reference potential of the source of the high-side switching element and the reference potential of the gate driver for driving the high-side switching element both correspond to a potential at an output node of the half-bridge circuit. Because the potential at the output node varies according to the drive of the high-side switching element and the low-side switching element, the reference potential of the gate driver for driving the high-side switching element varies as well. When the high-side switching element is on, the reference potential is equivalent to the voltage applied to the drain of the high-side switching element (e.g., 600 V or higher). In the semiconductor device A1, the ground of the first semiconductor element 11 is spaced apart from the ground of the third semiconductor element 13. Accordingly, in the case where the semiconductor device A1 is used as the gate driver for driving the high-side switching element, a voltage equivalent to the voltage applied to the drain of the high-side switching element is transiently applied to the ground of the third semiconductor element 13.

The following describes advantages of the semiconductor device A1.

The semiconductor device A1 includes the first wires 41 connected to the first semiconductor element 11 and the second semiconductor element 12, and the second wires 42 connected to the first semiconductor element 11 and the first terminal leads 31. The first wires 41 contain the first metal. Each of the second wires 42 includes a first core 42A containing the second metal, and a first surface layer 42B containing the third metal and covering the first core 42A. The atomic number of the second metal is smaller than the atomic number of the first metal. As such, when X-rays are applied to the semiconductor device A1, the second wires 42 transmit the X-rays more easily than the first wires 41. This makes it possible to obtain an X-ray image of the first wires 41. Accordingly, x-ray inspection can be employed to check whether the shape and height of each of the first wires 41 contribute to ensuring the dielectric strength required for the semiconductor device A1. Furthermore, the third metal has a greater bonding strength with respect to the first terminal leads 31 than the second metal. This makes it possible to prevent the deterioration of the bonding state of the second wires 42 with respect to the first terminal leads 31 (such as cracking) while reducing the cost of the second wires 42. Thus, the semiconductor device A1 can achieve the cost reduction while ensuring the required dielectric strength.

It is preferable that the first metal be gold and the second metal be copper. This makes it possible to accurately set the shape and height of the first wires 41 to ensure the dielectric strength required for the semiconductor device A1, and to reduce the cost of the second wires 42 efficiently. Furthermore, it is preferable that the third metal be palladium. This increases the bonding area of the first surface layers 42B of the second wires 42 with respect to the first terminal leads 31, thereby improving the bonding strength of the second wires 42 to the first terminal leads 31.

Furthermore, the semiconductor device A1 includes the third wires 43 connected to the second semiconductor element 12 and the third semiconductor element 13, and the fourth wires 44 connected to the third semiconductor element 13 and the second terminal leads 32. The third wires 43 contain the fourth metal. Each of the fourth wires 44 includes a second core 44A containing the fifth metal, and a second surface layer 44B containing the sixth metal and covering the second core 44A. The atomic number of the fifth metal is smaller than the atomic number of the fourth metal. The sixth metal has a greater bonding strength with respect to the second terminal leads 32 than the fifth metal. Accordingly, the third wires 43 and the fourth wires 44 can achieve the same advantages as the first wires 41 and the second wires 42 described above. In this case, it is preferable that the fourth metal be gold and the fifth metal be copper. Furthermore, it is preferable that the sixth metal be palladium.

Each of the second wires 42 has a first main portion 421, and a first end portion 422 positioned between the first main portion 421 and one of the first terminal leads 31. The first end portion 422 includes a first tapered portion 422A adjacent to the first main portion 421, and the dimension d (see FIG. 9) of the first tapered portion 422A in the thickness direction z decreases with distance from the first main portion 421. This facilitates the transfer of the tensile stress in the first end portion 422 caused as a result of bonding with the first terminal lead 31, thereby alleviating stress concentration in the first end portion 422. Furthermore, as shown in FIG. 9, the bonding interface 311A between the first terminal lead 31 and the second wire 42 extends over the first main portion 421 and the first end portion 422 as viewed in the thickness direction z. In this way, the bonding of the second wire 42 to the first terminal lead 31 is shared between the first end portion 422 and the first main portion 421, thereby alleviating stress concentration more effectively.

Each of the fourth wires 44 has a second main portion 441, and a second end portion 442 positioned between the second main portion 441 and one of the second terminal leads 32. The second end portion 442 includes a second tapered portion 442A adjacent to the second main portion 441, and the dimension d (see FIG. 11) of the second tapered portion 442A in the thickness direction z decreases with distance from the second main portion 441. Furthermore, as shown in FIG. 11, the bonding interface 321A between the second terminal lead 32 and the fourth wire 44 extends over the second main portion 441 and the second end portion 442 as viewed in the thickness direction z. Accordingly, the relationship between the second terminal leads 32 and the fourth wires 44 can also achieve the same advantages as the relationship between the first terminal leads 31 and the second wires 42 described above.

The first semiconductor element 11 has the first metal layers 111 connected to the second wires 42, and the second metal layers 112 overlapping with the first metal layers 111 as viewed in the thickness direction z and positioned inward in the thickness direction z. Each of the first metal layers 111 has higher flexural rigidity than each of the second metal layers 112. This prevents cracks from occurring in the first metal layers 111 due to impacts transmitted from the second wires 42 to the first metal layers 111 when the second wires 42 are connected to the first metal layers 111.

The semiconductor device A1 further includes the sealing resin 50 covering the first semiconductor element 11, the second semiconductor element 12, the first wires 41, and the second wires 42. The sulfur content of the sealing resin 50 per unit mass is no greater than 300 μg/g. The first core 42A of each of the second wires 42, which contains the second metal (copper), is covered with the first surface layer 42B containing the third metal (palladium); therefore, the first core 42A is relatively resistant to corrosion. Furthermore, it is possible to suppress the corrosion of the first core 42A more effectively by setting the upper limit of the sulfur content of the sealing resin 50 per unit mass.

In the semiconductor device A1, a portion of each of the first island lead 21, the second island lead 22, the first terminal leads 31, and the second terminal leads 32 is exposed from one of the pair of first side surfaces 53 of the sealing resin 50. In this case, the first island lead 21, the second island lead 22, the first terminal leads 31, and the metal layers 33 are located away from the pair of second side surfaces 54 of the sealing resin 50. As such, in the semiconductor device A1, no metal members such as island supports are exposed from the pair of second side surfaces 54. This improves the dielectric strength of the semiconductor device A1.

In the semiconductor device A1, the first island portion 211 of the first island lead 21, which is larger in area than the second island portion 221 of the second island lead 22, is formed with the through holes 213. This makes it possible to prevent insufficient filling of the sealing resin 50 when the sealing resin 50 is injected into the mold during the formation of the sealing resin 50. As a result, voids in the sealing resin 50 can be suppressed effectively. This contributes to the suppression of a decrease in the dielectric strength of the semiconductor device A1.

Figure 12:
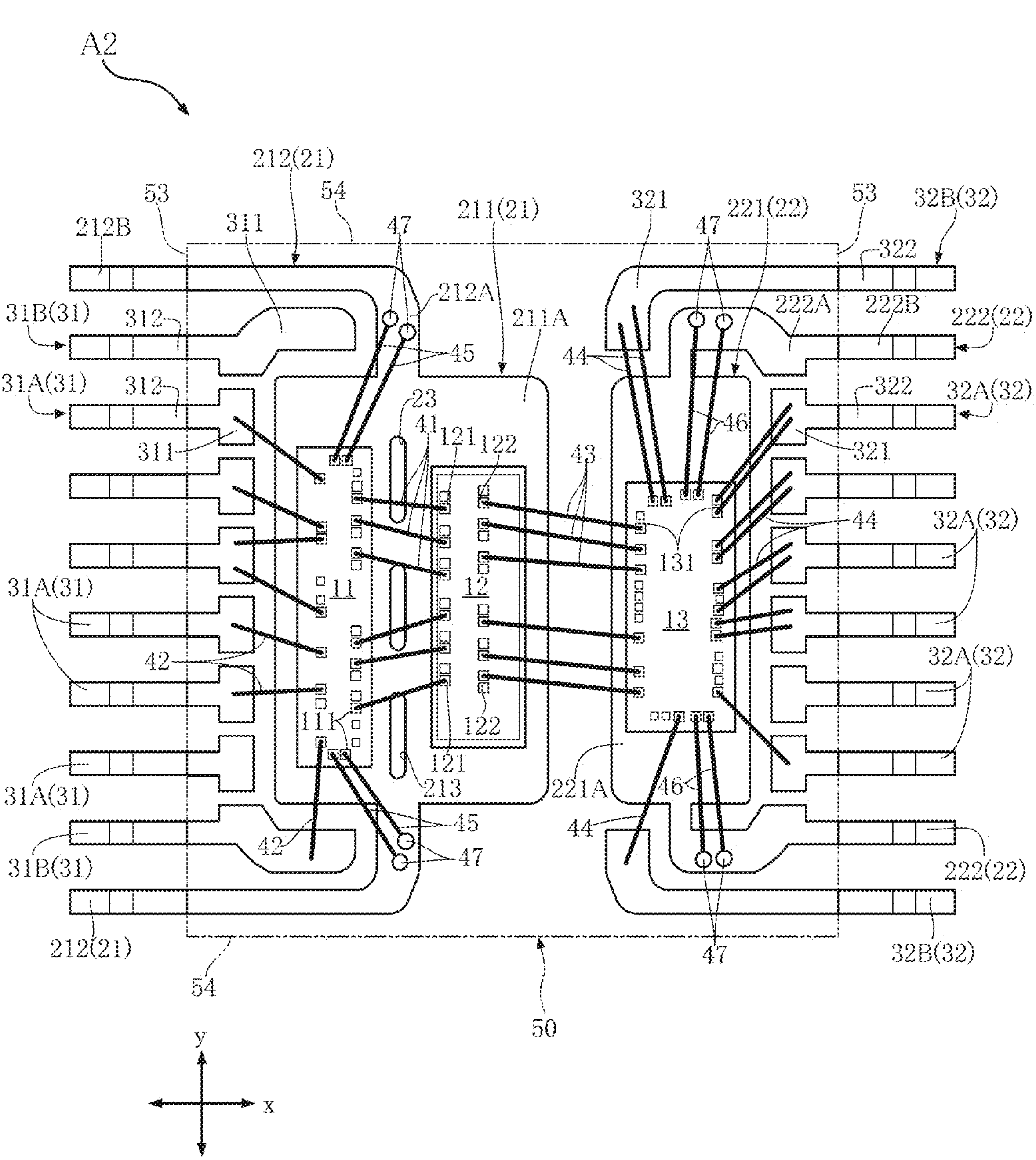
FIG. 12 is a plan view illustrating a semiconductor device according to a second embodiment of the present disclosure, as seen through a sealing resin.
Figure 13:
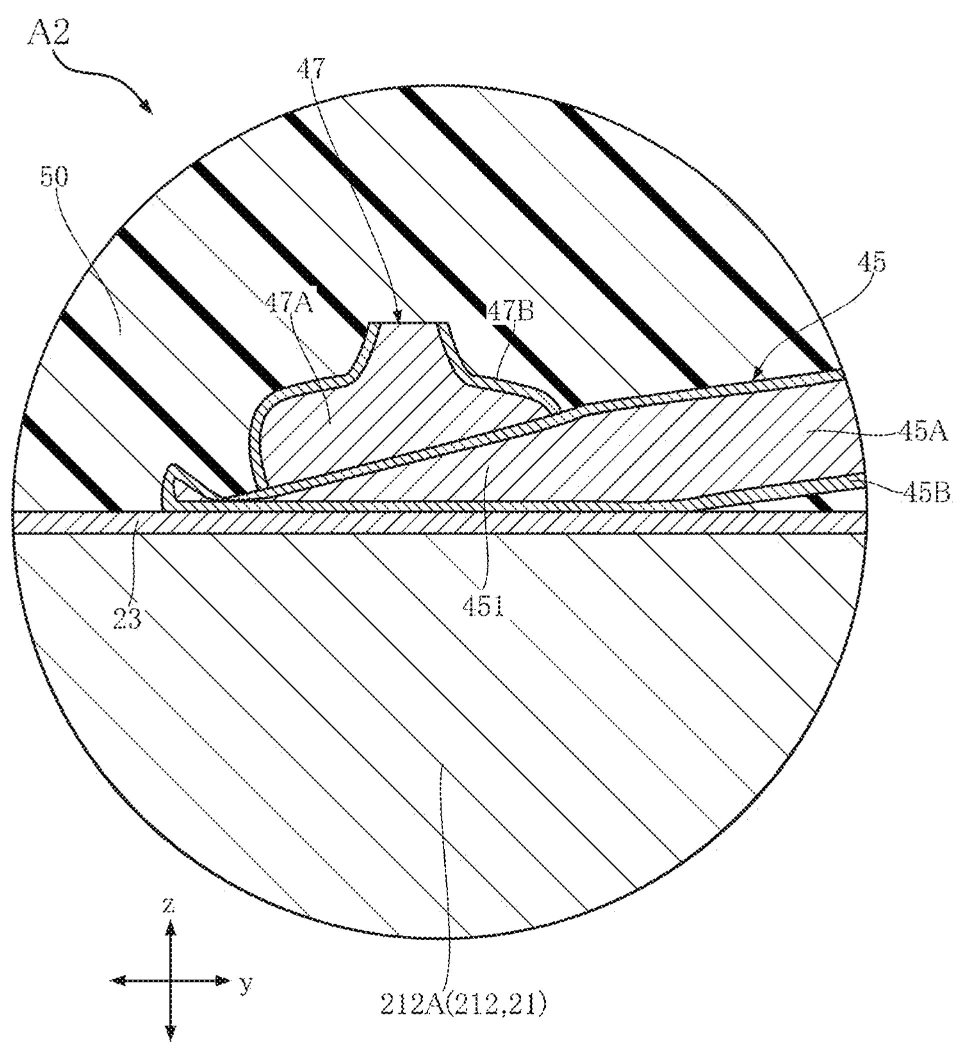
FIG. 13 is a partially enlarged cross-sectional view of the semiconductor device in FIG. 12.
Figure 14:
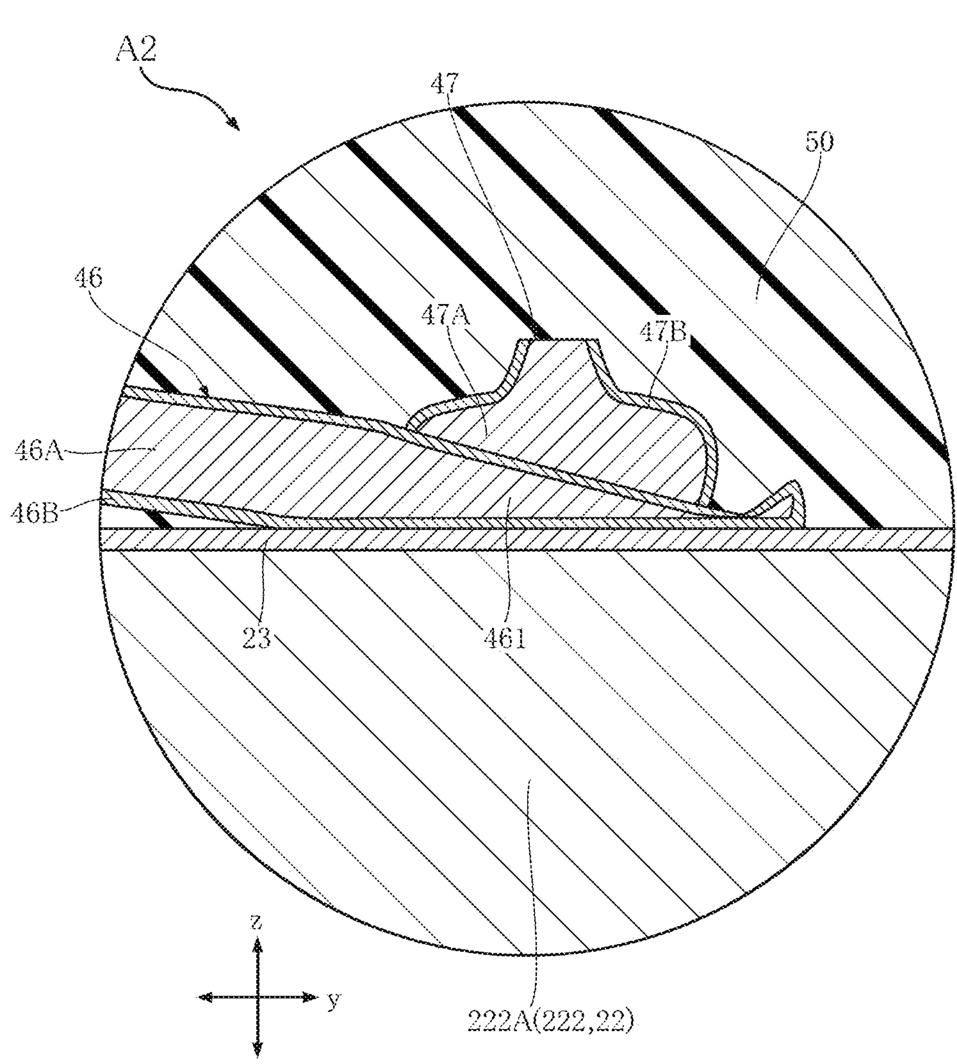
FIG. 14 is a partially enlarged cross-sectional view of the semiconductor device in FIG. 12.

The following describes a semiconductor device A2 according to a second embodiment of the present disclosure, with reference to FIGS. 12 to 14. In these figures, elements that are the same as or similar to the elements of the semiconductor device A1 described above are provided with the same reference signs, and descriptions thereof are omitted. In FIG. 12, the sealing resin 50 is shown in phantom for convenience of understanding, and is indicated by an imaginary line.

The semiconductor device A2 is different from the semiconductor device A1 in further including a plurality of metal blocks 47.

As shown in FIGS. 12 and 13, the metal blocks 47 are individually bonded to the fifth wires 45. Each of the fifth wires 45 includes a third core 45A and a third surface layer 45B. The third core 45A contains the second metal (copper) described above. The third surface layer 45B contains the third metal (palladium) described above, and covers the third core 45A. Each of the fifth wires 45 has a connecting portion 451. Each of the connecting portions 451 is connected to the covered portion 212A of one of the two first terminal portions 212 of the first island lead 21. The covered portion 212A includes a metal layer 23. The composition of the metal layer 23 includes silver. The connecting portion 451 is in contact with the metal layer 23.

As shown in FIG. 13, each of the metal blocks 47 includes a core 47A and a surface layer 47B. The core 47A contains the second metal (copper) described above. The surface layer 47B contains the third metal (palladium) described above, and covers the core 47A. The metal blocks 47 are bonded to the connecting portions 451 of the fifth wires 45. The core 47A and the surface layer 47B of each of the metal blocks 47 are in contact with the third surface layer 45B of each of the fifth wires 45.

As shown in FIGS. 12 and 14, the metal blocks 47 are individually bonded to the sixth wires 46. Each of the sixth wires 46 includes a fourth core 46A and a fourth surface layer 46B. The fourth core 46A contains the fifth metal (copper) described above. The fourth surface layer 46B contains the sixth metal (palladium) described above, and covers the fourth core 46A. Each of the sixth wires 46 has a connecting portion 461. Each of the connecting portions 461 is connected to the covered portion 222A of one of the two second terminal portions 222 of the second island lead 22. The covered portion 222A includes a metal layer 23. The connecting portion 461 is in contact with the metal layer 23.

As shown in FIG. 14, the metal blocks 47 are bonded to the connecting portions 461 of the sixth wires 46. The core 47A and the surface layer 47B of each of the metal blocks 47 are in contact with the fourth surface layer 46B of each of the sixth wires 46.

The following describes advantages of the semiconductor device A2.

The semiconductor device A2 includes the first wires 41 connected to the first semiconductor element 11 and the second semiconductor element 12, and the second wires 42 connected to the first semiconductor element 11 and the first terminal leads 31. The first wires 41 contain the first metal. Each of the second wires 42 includes a first core 42A containing the second metal, and a first surface layer 42B containing the third metal and covering the first core 42A. The atomic number of the second metal is smaller than the atomic number of the first metal. The third metal has a greater bonding strength with respect to the first terminal leads 31 than the second metal. Thus, the semiconductor device A2 can also achieve the cost reduction while ensuring the required dielectric strength. Furthermore, the semiconductor device A2 adopts a configuration common to the semiconductor device A1, and thereby achieves advantages similar to those achieved by the semiconductor device A1.

The semiconductor device A2 includes the fifth wires 45 connected to the first semiconductor element 11 and the first terminal portions 212 of the first island lead 21. The semiconductor device A2 further includes the metal blocks 47 bonded to the connecting portions 451 of the fifth wires 45 that are connected to the first terminal portions 212. This improves the bonding strength of the fifth wires 45 to the first terminal portions 212, thereby suppressing cracks in the fifth wires 45. This contributes to suppressing the difference between the potential of the ground of the first semiconductor element 11 and the potential of each of the first terminal portions 212.

The semiconductor device A2 includes the sixth wires 46 connected to the third semiconductor element 13 and the second terminal portions 222 of the second island lead 22. Furthermore, the semiconductor device A2 includes the metal blocks 47 bonded to the connecting portions 461 of the sixth wires 46 that are connected to the second terminal portions 222. This improves the bonding strength of the sixth wires 46 to the second terminal portions 222, thereby suppressing cracks in the sixth wires 46. This contributes to suppressing the difference between the potential of the ground of the third semiconductor element 13 and the potential of each of the second terminal portions 222. The potential of each of the second terminal portions 222 is equal to the potential of the electrode of the switching element to be driven in the semiconductor device A1. Since the potential of each of the second terminal portions 222 changes over time, suppression of the difference between the potential of the ground of the third semiconductor element 13 and the potential of each of the second terminal portions 222 contributes to the stable driving of the switching element.

Figure 15:
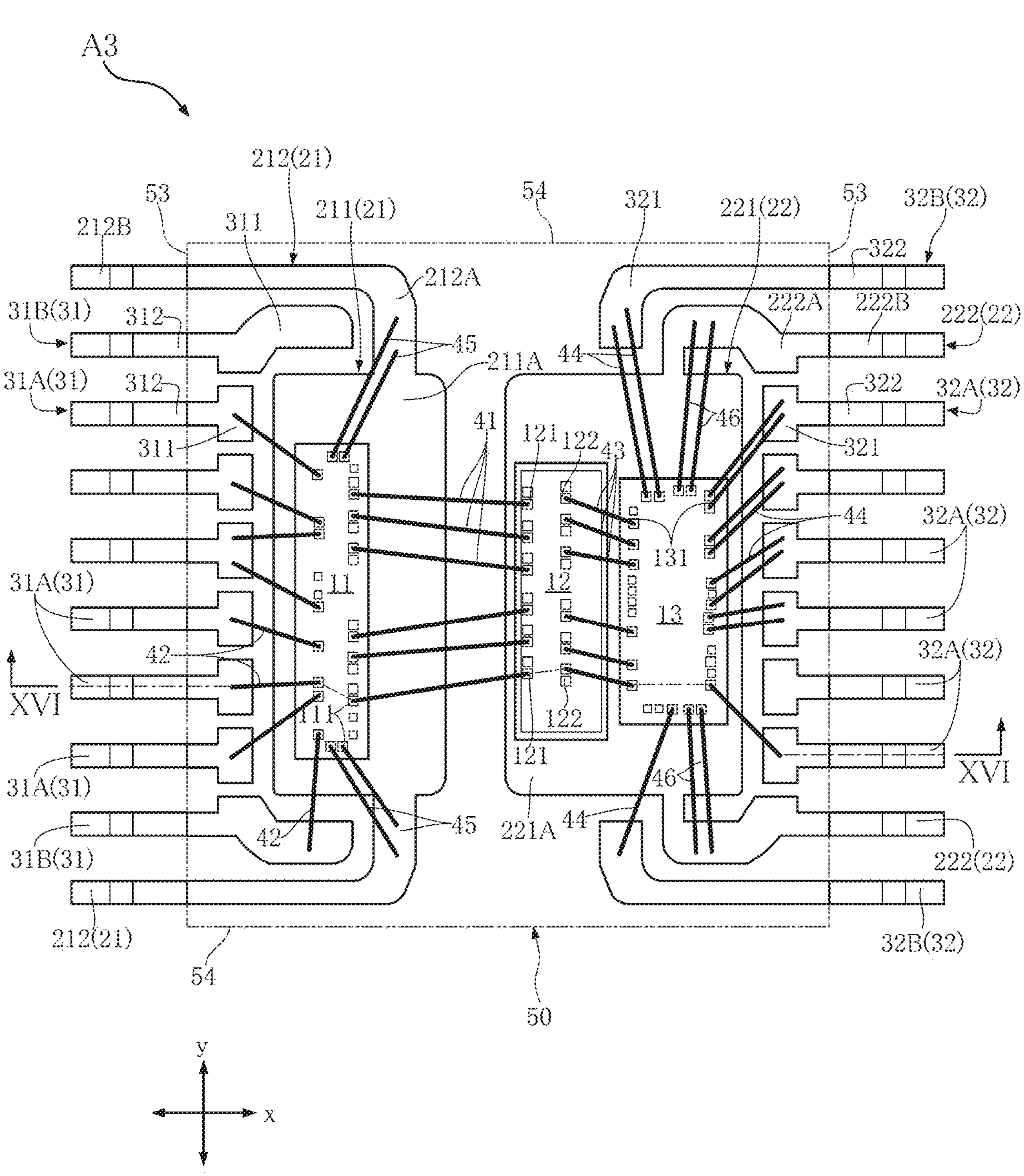
FIG. 15 is a plan view illustrating a semiconductor device according to a third embodiment of the present disclosure, as seen through a sealing resin.
Figure 16:
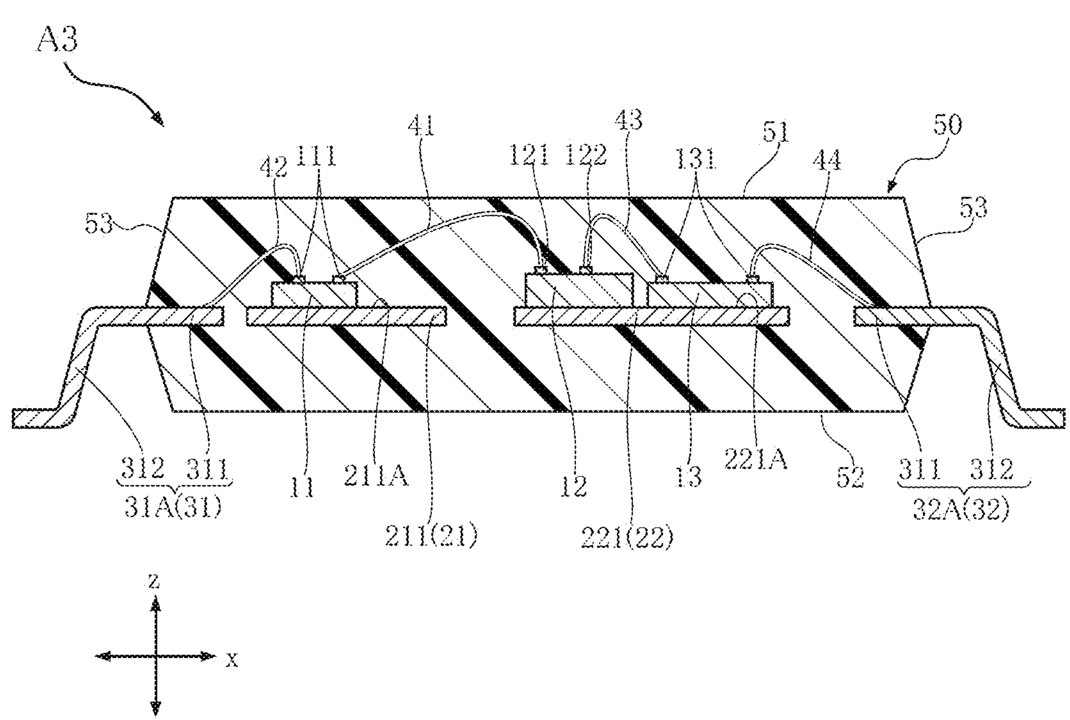
FIG. 16 is a cross-sectional view taken along line XVI-XVI in FIG. 15.

The following describes a semiconductor device A3 according to a third embodiment of the present disclosure, with reference to FIGS. 15 and 16. In these figures, elements that are the same as or similar to the elements of the semiconductor device A1 described above are provided with the same reference signs, and descriptions thereof are omitted. In FIG. 15, the sealing resin is shown in phantom for convenience of understanding, and is indicated by an imaginary line.

The semiconductor device A3 is different from the semiconductor device A1 in the mounting configuration of the second semiconductor element 12.

As shown in FIGS. 15 and 16, the second semiconductor element 12 is mounted on the second mounting surface 221A of the second island portion 221 of the second island lead 22. Accordingly, in the semiconductor device A3, the first wires 41 bridge the first island portion 211 of the first island lead 21 and the second island portion 221 of the second island lead 22. In this way, the second semiconductor element 12 can be mounted on the second island portion 221 even when the second island portion 221 has a higher potential than the first island portion 211.

The following describes advantages of the semiconductor device A3.

The semiconductor device A3 includes the first wires 41 connected to the first semiconductor element 11 and the second semiconductor element 12, and the second wires 42 connected to the first semiconductor element 11 and the first terminal leads 31. The first wires 41 contain the first metal. Each of the second wires 42 includes a first core 42A containing the second metal, and a first surface layer 42B containing the third metal and covering the first core 42A. The atomic number of the second metal is smaller than the atomic number of the first metal. The third metal has a greater bonding strength with respect to the first terminal leads 31 than the second metal. Thus, the semiconductor device A3 can also achieve the cost reduction while ensuring the required dielectric strength. Furthermore, the semiconductor device A3 adopts a configuration common to the semiconductor device A1, and thereby achieves advantages similar to those achieved by the semiconductor device A1.

The present disclosure is not limited to the foregoing embodiments. Various design changes can be made to the specific configurations of the elements of the present disclosure.

The present disclosure includes embodiments described in the following clauses.

Clause 1.

A semiconductor device comprising:

a first semiconductor element;

a first circuit and a second circuit that have different potentials from each other;

a second semiconductor element that is electrically connected to the first semiconductor element, the second semiconductor element relaying a mutual signal between the first circuit and the second circuit and insulating the first circuit and the second circuit from each other;

a first terminal lead electrically connected to the first semiconductor element;

a first wire connected to the first semiconductor element and the second semiconductor element; and a second wire connected to the first semiconductor element and the first terminal lead, wherein the first wire contains a first metal, the second wire includes a first core containing a second metal, and a first surface layer containing a third metal and covering the first core, an atomic number of the second metal is smaller than an atomic number of the first metal, and the third metal has a greater bonding strength with respect to the first terminal lead than the second metal.

Clause 2.

The semiconductor device according to clause 1, further comprising:

a third semiconductor element electrically connected to the second semiconductor element;

a second terminal lead electrically connected to the third semiconductor element;

a third wire connected to the second semiconductor element and the third semiconductor element; and a fourth wire connected to the third semiconductor element and the second terminal lead, wherein the third wire contains a fourth metal, the fourth wire includes a second core containing a fifth metal, and a second surface layer containing a sixth metal and covering the second core, an atomic number of the fifth metal is smaller than an atomic number of the fourth metal, and the sixth metal has a greater bonding strength with respect to the second terminal lead than the fifth metal.

Clause 3.

The semiconductor device according to clause 2, further comprising a first island lead, wherein the first circuit includes the first semiconductor element, and the second circuit includes the third semiconductor element, the first island lead is included in the first circuit, and the first semiconductor element is mounted on the first island lead.

Clause 4.

The semiconductor device according to clause 3, further comprising a second island lead located away from the first island lead and included in the second circuit, wherein the third semiconductor element is mounted on the second island lead.

Clause 5.

The semiconductor device according to clause 4, wherein the second semiconductor element is mounted on the first island lead.

Clause 6.

The semiconductor device according to clause 4, wherein the second semiconductor element is mounted on the second island lead.

Clause 7.

The semiconductor device according to any of clauses 3 to 6, wherein in a first direction, the third semiconductor element is located opposite from the first semiconductor element with respect to the second semiconductor element.

Clause 8.

The semiconductor device according to any of clauses 3 to 7, wherein the second circuit has a higher potential than the first circuit.

Clause 9.

The semiconductor device according to any of clauses 3 to 8, further comprising a fifth wire and a metal block, wherein the first island lead has a first island portion on which the first semiconductor element is mounted, and a first terminal portion extending from the first island portion, the fifth wire is connected to the first semiconductor element and the first terminal portion, and the metal block is bonded to a connecting portion of the fifth wire that is connected to the first terminal portion.

Clause 10.

The semiconductor device according to any of clauses 2 to 9, wherein the first metal and the fourth metal are gold.

Clause 11.

The semiconductor device according to any of clauses 2 to 10, wherein the second metal and the fifth metal are copper.

Clause 12.

The semiconductor device according to any of clauses 2 to 11, wherein the third metal and the sixth metal are palladium.

Clause 13.

The semiconductor device according to any of clauses 2 to 12, wherein the second wire has a first main portion, and a first end portion positioned between the first main portion and the first terminal lead, the first end portion includes a first tapered portion adjacent to the first main portion, and a dimension of the first tapered portion in a thickness direction of the first terminal lead decreases with distance from the first main portion, and a bonding interface between the first terminal lead and the second wire extends over the first main portion and the first end portion as viewed in the thickness direction of the first terminal lead.

Clause 14.

The semiconductor device according to any of clauses 2 to 13, wherein the fourth wire has a second main portion, and a second end portion positioned between the second main portion and the second terminal lead, the second end portion includes a second tapered portion adjacent to the second main portion, and a dimension of the second tapered portion in a thickness direction of the second terminal lead decreases with distance from the second main portion, and a bonding interface between the second terminal lead and the fourth wire extends over the second main portion and the second end portion as viewed in the thickness direction of the second terminal lead.

Clause 15.

The semiconductor device according to any of clauses 1 to 14, wherein the first semiconductor element has a first metal layer connected to the second wire, and a second metal layer overlapping with the first metal layer as viewed in a thickness direction of the first semiconductor element and positioned inward in the thickness direction of the first semiconductor element, and the first metal layer has higher flexural rigidity than the second metal layer.

Clause 16.

The semiconductor device according to any of clauses 1 to further comprising a sealing resin covering the first semiconductor element, the second semiconductor element, the first wire, and the second wire, wherein a sulfur content of the sealing resin per unit mass is no greater than 300 μg/g.

Clause 17.

The semiconductor device according to any of clauses 1 to 16, wherein the second semiconductor element is of an inductive type.

REFERENCE SIGNS

A1, A2, A3: Semiconductor device
11: First semiconductor element (Controller)
11A: Element body 111: First metal layer
112: Second metal layer 113: Via
114: Interlayer insulating film 115: Passivation film
116: Surface protection film 12: Second semiconductor element
121: First electrode 122: Second electrode
13: Second semiconductor element (Gate driver)
131: Third metal layer
132: Fourth metal layer 133: Via
134: Interlayer insulating film 135: Passivation film
136: Surface protection film 21: First island lead
211: First island portion 211A: First mounting surface
212: First terminal portion 212A: Covered portion
212B: Exposed portion 213: Through hole
22: Second island lead 221: Second island portion
221A: Second mounting surface 222: Second terminal portion
222A: Covered portion 222B: Exposed portion
23: Metal layer 31: First terminal lead
31A: First inner lead 31B: First outer lead
311: Covered portion 311A: Bonding interface
312: Exposed portion 32: Second terminal lead
32A: Second inner lead 32B: Second outer lead
321: Covered portion 321A: Bonding interface
322: Exposed portion 33: Metal layer
41: First wire 42: Second wire
42A: First core 42B: First surface layer
421: First main portion 422: First end portion
422A: First tapered portion 422B: First tip
43: Third wire 44: Fourth wire
44A: Second core 44B: Second surface layer
441: Second main portion 442: Second end portion
442A: Second tapered portion 442B: Second tip
45 Fifth wire 45A: Third core
45B Third surface layer 451: Connecting portion
46: Sixth wire 46A: Fourth core
46B: Fourth surface layer 461: Connecting portion
47: Metal block 47A: Core
47B: Surface layer 50: Sealing resin
51: Top surface 52: Bottom surface
53: First side surface 531: First upper portion
532: First lower portion 533: First intermediate portion
54: Second side surface 541: Second upper portion
542: Second lower portion 543: Second intermediate portion
d: Dimension (Thickness direction) t1, t2, t3, t4: Thickness
z: Thickness direction x: First direction
y: Second direction

The invention claimed is:

1. A semiconductor device comprising:

a first circuit including a first semiconductor element;

a second circuit including a third semiconductor element;

a second semiconductor element that is electrically connected to each of the first semiconductor element and the third semiconductor element, the second semiconductor element relaying a mutual signal between the first circuit and the second circuit and insulating the first circuit and the second circuit from each other;

a first terminal lead electrically connected to the first semiconductor element and included in the first circuit;

a second terminal lead electrically connected to the third semiconductor element and included in the second circuit;

a first wire connected to the first semiconductor element and the second semiconductor element and included in the first circuit;

a second wire connected to the first semiconductor element and the first terminal lead and included in the first circuit;

a third wire connected to the second semiconductor element and the third semiconductor element and included in the second circuit;

a fourth wire connected to the third semiconductor element and the second terminal lead and included in the second circuit; and a sealing resin covering the first semiconductor element, the second semiconductor element, the third semiconductor element, the first wire, the second wire, the third wire and the fourth wire, wherein an electric potential of the second circuit is higher than an electric potential of the first circuit, each of the first wire and the third wire contains a first metal, the second wire includes a first core containing a second metal, and a first surface layer containing a third metal and covering the first core, the fourth wire includes a second core containing the second metal, and a second surface layer containing the third metal and covering the second core, an atomic number of the second metal is smaller than an atomic number of the first metal, and the third metal has a greater bonding strength with respect to each of the first terminal lead and the second terminal lead than the second metal.

2. The semiconductor device according to claim 1, further comprising a first island lead, wherein the first island lead is included in the first circuit, and the first semiconductor element is mounted on the first island lead.

3. The semiconductor device according to claim 2, further comprising a second island lead located away from the first island lead and included in the second circuit, wherein the third semiconductor element is mounted on the second island lead.

4. The semiconductor device according to claim 3, wherein the second semiconductor element is mounted on the first island lead.

5. The semiconductor device according to claim 3, wherein the second semiconductor element is mounted on the second island lead.

6. The semiconductor device according to claim 2, wherein in a first direction, the third semiconductor element is located opposite from the first semiconductor element with respect to the second semiconductor element.

7. The semiconductor device according to claim 2, further comprising a fifth wire and a metal block, wherein the first island lead has a first island portion on which the first semiconductor element is mounted, and a first terminal portion extending from the first island portion, the fifth wire is connected to the first semiconductor element and the first terminal portion, and the metal block is bonded to a connecting portion of the fifth wire that is connected to the first terminal portion.

8. The semiconductor device according to claim 1, wherein the first metal is gold.

9. The semiconductor device according to claim 1, wherein the second metal is copper.

10. The semiconductor device according to claim 1, wherein the third metal is palladium.

11. The semiconductor device according to claim 1,
wherein the second wire has a first main portion, and a first end portion positioned between the first main portion and the first terminal lead,
the first end portion includes a first tapered portion adjacent to the first main portion, and a dimension of the first tapered portion in a thickness direction of the first terminal lead decreases with distance from the first main portion, and
a bonding interface between the first terminal lead and the second wire extends over the first main portion and the first end portion as viewed in the thickness direction of the first terminal lead.

12. The semiconductor device according to claim 1,
wherein the fourth wire has a second main portion, and a second end portion positioned between the second main portion and the second terminal lead,
the second end portion includes a second tapered portion adjacent to the second main portion, and a dimension of the second tapered portion in a thickness direction of the second terminal lead decreases with distance from the second main portion, and
a bonding interface between the second terminal lead and the fourth wire extends over the second main portion and the second end portion as viewed in the thickness direction of the second terminal lead.

13. The semiconductor device according to claim 1,
wherein the first semiconductor element has a first metal layer connected to the second wire, and a second metal layer overlapping with the first metal layer as viewed in a thickness direction of the first semiconductor element and positioned inward in the thickness direction of the first semiconductor element, and
the first metal layer has higher flexural rigidity than the second metal layer.

14. The semiconductor device according to claim 1,
wherein a sulfur content of the sealing resin per unit mass is no greater than 300 μg/g.

15. The semiconductor device according to claim 1, wherein the second semiconductor element is of an inductive type.

* * * * *